United States Patent
Lin et al.

(10) Patent No.: US 7,372,161 B2
(45) Date of Patent: May 13, 2008

(54) POST PASSIVATION INTERCONNECTION SCHEMES ON TOP OF THE IC CHIPS

(75) Inventors: Mou-Shiung Lin, Hsin-Chu (TW);
Chiu-Ming Chou, Kao-Hsiung (TW);
Chien-Kang Chou, Shin-Hwa (TW)

(73) Assignee: Megica Corporation, Hsin-Chu (TW)

( * ) Notice: Subject to any disclaimer, the term of this patent is extended or adjusted under 35 U.S.C. 154(b) by 125 days.

(21) Appl. No.: 11/017,145

(22) Filed: Dec. 20, 2004

(65) Prior Publication Data

US 2005/0104177 A1    May 19, 2005

Related U.S. Application Data

(60) Continuation-in-part of application No. 10/962,963, filed on Oct. 12, 2004, and a continuation-in-part of application No. 10/278,106, filed on Oct. 22, 2002, now Pat. No. 6,734,563, which is a division of application No. 09/691,497, filed on Oct. 18, 2000, now Pat. No. 6,495,442.

(51) Int. Cl.
*H01L 23/45* (2006.01)

(52) U.S. Cl. .................. 257/773; 257/690; 257/700; 257/774

(58) Field of Classification Search ............ 257/690, 257/700, 691, 920, 773, 774; 438/614, 615, 438/616, 622, 631, 637, 638
See application file for complete search history.

(56) References Cited

U.S. PATENT DOCUMENTS

| | | | |
|---|---|---|---|
| 4,423,547 A | 1/1984 | Farrar et al. | |
| 4,618,878 A | 10/1986 | Aoyama et al. | |
| 5,083,187 A | 1/1992 | Lamson et al. | |
| 5,108,950 A | 4/1992 | Wakabayashi et al. | |
| 5,227,012 A | 7/1993 | Brandli et al. | |
| 5,384,488 A | 1/1995 | Golshan et al. | |
| 5,416,356 A | 5/1995 | Staudinger et al. | |
| 5,468,984 A | 11/1995 | Efland et al. | |
| 5,478,773 A | 12/1995 | Dow et al. | |
| 5,659,201 A | 8/1997 | Wollesen | |
| 5,665,639 A | 9/1997 | Seppala et al. | |
| 5,789,303 A | 8/1998 | Leung et al. | |
| 5,834,844 A | 11/1998 | Akagawa et al. | |
| 5,854,513 A | 12/1998 | Kim | |
| 5,929,508 A | 7/1999 | Delgado et al. | |
| 5,969,424 A | 10/1999 | Matsuki et al. | |
| 6,020,640 A | 2/2000 | Efland et al. | |

(Continued)

*Primary Examiner*—Kevin M Picardat
(74) *Attorney, Agent, or Firm*—Saile Ackerman LLC; Stephen B. Ackerman; Rosemary L. S. Pike

(57) ABSTRACT

A new method is provided for the creation of interconnect lines. Fine line interconnects are provided in a first layer of dielectric overlying semiconductor circuits that have been created in or on the surface of a substrate. A layer of passivation is deposited over the layer of dielectric and a thick second layer of dielectric is created over the surface of the layer of passivation. Thick and wide post-passivation interconnect lines are created in the thick second layer of dielectric. The first layer of dielectric may also be eliminated, creating the wide thick passivation interconnect network on the surface of the layer of passivation that has been deposited over the surface of a substrate.

33 Claims, 15 Drawing Sheets

U.S. PATENT DOCUMENTS

| | | |
|---|---|---|
| 6,030,877 A | 2/2000 | Lee et al. |
| 6,066,877 A | 5/2000 | Williams et al. |
| 6,103,552 A | 8/2000 | Lin |
| 6,144,100 A | 11/2000 | Shen et al. |
| 6,146,958 A | 11/2000 | Zhao et al. |
| 6,159,773 A | 12/2000 | Lin |
| 6,184,143 B1 | 2/2001 | Ohashi et al. |
| 6,187,680 B1 | 2/2001 | Costrini et al. |
| 6,229,221 B1 | 5/2001 | Kloen et al. |
| 6,236,101 B1 | 5/2001 | Erdeljac et al. |
| 6,272,736 B1 | 8/2001 | Lee |
| 6,303,423 B1 | 10/2001 | Lin ............... 438/238 |
| 6,383,916 B1 | 5/2002 | Lin ............... 438/637 |
| 6,455,885 B1 | 9/2002 | Lin |
| 6,459,135 B1 | 10/2002 | Basteres et al. |
| 6,465,879 B1 | 10/2002 | Taguchi |
| 6,472,745 B1 | 10/2002 | Iizuka |
| 6,495,442 B1 * | 12/2002 | Lin et al. ............... 438/618 |
| 6,501,169 B1 | 12/2002 | Aoki et al. |
| 6,544,880 B1 | 4/2003 | Akram |
| 6,545,354 B1 | 4/2003 | Aoki et al. |
| 6,560,862 B1 | 5/2003 | Chen et al. |
| 6,605,528 B1 | 8/2003 | Lin et al. |
| 6,636,139 B2 | 10/2003 | Tsai et al. |
| 6,649,509 B1 | 11/2003 | Lin et al. |
| 6,683,380 B2 | 1/2004 | Efland et al. |
| 6,707,159 B1 | 3/2004 | Kumamoto et al. |
| 6,734,563 B2 * | 5/2004 | Lin et al. ............... 257/773 |
| 6,800,555 B2 | 10/2004 | Test et al. |
| 2001/0035452 A1 | 11/2001 | Test et al. |
| 2002/0017730 A1 | 2/2002 | Tahara et al. |
| 2005/0104177 A1 | 5/2002 | Lin et al. |
| 2002/0109232 A1 | 8/2002 | Lin et al. |
| 2002/0115282 A1 | 8/2002 | Lin et al. |
| 2002/0158334 A1 | 10/2002 | Vu et al. |
| 2003/0102551 A1 | 6/2003 | Kikuchi |
| 2004/0089951 A1 | 5/2004 | Lin |
| 2004/0166659 A1 | 8/2004 | Lin et al. |
| 2006/0049483 A1 | 3/2006 | Lin et al. |
| 2006/0049524 A1 | 3/2006 | Lin et al. |
| 2006/0049525 A1 | 3/2006 | Lin et al. |
| 2006/0063378 A1 | 3/2006 | Lin et al. |
| 2006/0076687 A1 | 4/2006 | Lin et al. |

* cited by examiner

POST PASSIVATION INTERCONNECTION SCHEMES ON TOP OF THE IC CHIPS

This application is a continuation-in-part of application No. 10/962,963, filed on Oct. 12, 2004, now pending.

RELATED PATENT APPLCIATIONS

This application is related to, Ser. No. 10/685,872, filed on Oct. 15, 2003, now pending, and to Ser. No. 10/278,106, filed on Oct. 22, 2002, now U.S. Pat. No. 6,734,563, which is a divisional of Ser. No. 09/691,497, filed on Oct. 18, 2000, now U.S. Pat. No. 6,495,442, all assigned to a common assignee and all incorporated herein by reference in their entirety.

The application is also related to application No. 09/721, 722, filed on Nov. 27, 2000, now U.S. Pat. No. 6,303,423, assigned to a common assignee and incorporated herein by reference in its entirety.

BACKGROUND OF THE INVENTION (1) Field of the Invention

The invention relates to the fabrication of integrated circuit devices, and more particularly, to a method of post-passivation processing for the creation of conductive interconnects.

(2) Description of the Related Art

Improvements in semiconductor device performance are typically obtained by scaling down the geometric dimensions of Integrated Circuits; this results in a decrease in the cost per die while at the same time some aspects of semiconductor device performance are improved. The metal connections which connect the Integrated Circuit to other circuit or system components become of relative more importance and have, with the further miniaturization of the IC, an increasingly negative impact on the circuit performance. The capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, one approach has been to develop low resistance metal (such as copper) for the wires while low-k dielectric materials are used in between signal lines. Current practice is to create metal interconnection networks under a layer of passivation. This approach, however, limits the interconnect network to fine line interconnects and the therewith associated high line capacitance and high line resistance. The latter two parameters, because of their relatively high values, degrade circuit performance, an effect which becomes even more severe for higher frequency applications and for long interconnect lines that are, for instance, used for clock distribution lines. Also, fine line interconnect metal cannot carry high values of current that is typically needed for ground busses and for power busses.

From the aspect of IC metal interconnection history, sputtered aluminum has been a mainstream IC interconnection metal material since the 1960's. The aluminum film is sputtered to cover the whole wafer, and then the metal is patterned using photolithography methods and dry and/or wet etching. It is technically difficult and economically expensive to create thicker than 2 µm aluminum metal lines due to the cost and stress concerns of blanket sputtering. About 1995, damascene copper metal became an alternative for IC metal interconnection. In damascene copper, the insulator is patterned and copper metal lines are formed within the insulator openings by blanket electroplating copper and chemical mechanical polishing (CMP) to remove the unwanted copper. Electroplating the whole wafer with thick metal creates large stress. Furthermore, the thickness of damascene copper is usually defined by the insulator thickness, typically chemical vapor deposited (CVD) oxides, which does not offer the desired thickness due to stress and cost concerns. Again it is also technically difficult and economically expensive to create thicker than 2 µm copper lines.

It has previously been stated that it is of interest to the semiconductor art to provide a method of creating interconnect lines that removes typical limitations that are imposed on the interconnect wires, such as unwanted parasitic capacitances and high interconnect line resistance. U.S. Pat. No. 6,383,916 to the same inventor as the present invention provides such a method. An analogy can be drawn in this respect whereby the currently (prior art) used fine-line interconnection schemes, which are created under a layer of passivation and providing high density interconnects, are the streets in a city; in the post-passivation interconnection scheme of the above patent, the interconnections that are created above a layer of passivation and providing high performance interconnects can be considered the freeways between cities.

FIG. 1 shows a diagram of a silicon substrate on the surface of which has been created a conductive interconnect network. The chip structure that is shown in FIG. 1 addresses prior art power and ground distribution networks. The various features that have been highlighted in FIG. 1 are the following:

- 40, a silicon substrate on the surface of which has been created an interconnect network
- 42, a sample number of semiconductor circuits that have been created in or on the surface of the substrate 40
- 44, two electrostatic discharge (ESD) circuits created in or on the surface of the substrate 40; one ESD circuit is provided for each pad that is accessible for external connections (pads 52, see below)
- 46 is a layer of interconnect lines; these interconnect lines are above the surface of substrate 40 and under the layer 48 of passivation and represent a typical application of prior art fine-line interconnects; these fine-line interconnects of layer 46 typically have high resistance and high capacitance.
- 48 is a layer of passivation that is deposited over the surface of the layer 46 of interconnect lines. The passivation layer is the final layer of the IC process in the prior art. The passivation layer is used to protect the underlying devices and fine-line interconnection from damage by mobile ions, moisture, transition metals, and contamination.
- 50 is a power or ground bus that connects to the circuits 42 via fine-line interconnect lines provided in layer 46; this power or ground bus is typically of wider metal since this power or ground bus carries the accumulated current or ground connection for the devices 42. The power or ground buses are built in the fine line interconnect under the passivation layer. The fine line interconnection can be in one layer or more than one layer of metals.
- 52 is a power or ground pad that passes through the layer 48 of passivation and that has been connected to the power or ground bus 50.

From the above the following can be summarized: circuits are created in or on the surface of a silicon substrate, interconnect lines are created for these circuits for further interconnection to external circuitry, the circuits are, on a per I/O pad basis, provided with an ESD circuit; these circuits with their ESD circuit are connected to a power or ground pad that penetrates a layer of passivation. The layer of passivation is the final layer that overlies the created interconnect line structure; the interconnect lines underneath the layer of passivation are fine line interconnects and have all the electrical disadvantages of fine line interconnects such as high resistance and high capacitance.

Relating to the diagram that is shown in FIG. 1, the following comment applies: ESD circuits are, as is known in the art, provided for the protection of semiconductor circuits against unwanted electrostatic discharge. For this reason, each pad that connects a semiconductor circuit to the external circuits must be provided with an ESD circuit.

FIG. 2 shows a diagram of a prior art configuration that resembles the diagram shown in FIG. 1. The chip structure that is shown in FIG. 2 however relates to clock and signal distribution networks. FIG. 2 shows in addition (to the previously highlighted aspects of FIG. 1):

- 45 are two ESD circuits that are provided in or on the surface of the substrate 40; ESD circuits are always required for any external connection to an input/output (I/O) pad.
- 45' which are circuits that can be receiver or driver or I/O circuits for input (receiver) or output (driver) or I/O purposes respectively.
- 54 is a clock, signal, address, or data bus built in the fine line interconnection metal under the passivation layer. The clock, signal, or buses can be in one layer or in more than one layer of fine line interconnect metals.
- 56 is a clock or signal pad that has been extended through the layer 48 of passivation.

The same comments apply to the diagram that is shown in FIG. 2 as previously have been made with respect to FIG. 1, with as a summary statement that the layer of passivation is the final layer that overlies the created structure, and the interconnect lines underneath the layer of passivation are fine line interconnects and have all the electrical disadvantages of fine line interconnects such as high resistance and high parasitic capacitance.

Further with respect to FIG. 2 where pads 56 are signal or clock pads:

- pads 56 must be connected to ESD and driver/receiver or I/O circuits 45
- for signal or clock pads 56, these pads must be connected not only to ESD circuits but also to driver or receiver or I/O circuits, highlighted as circuit 45' in FIG. 2
- after (clock and signal) stimuli have passed through the ESD and driver/receiver or I/O circuits, these stimuli are further routed using, under prior art methods, fine-line interconnect wires. A layer of passivation is deposited over the dielectric layer in which the interconnect network has been created.

It is therefore of interest to the semiconductor art to provide a method of creating interconnect lines that removes typical limitations that are imposed on the interconnect wires, such as unwanted parasitic capacitances and high interconnect line resistance.

SUMMARY OF THE INVENTION

A principal objective of the invention is to provide a method for the creation of post-passivation interconnect metal that allows for the use of thick and wide metal.

Another objective of the invention is to create a new integrated circuit interconnection design architecture, analogous to the transportation networks, using the conventional IC fine-line interconnection under the passivation layer as the streets in the cities, and the newly created post-passivation interconnection above the passivation layer as the freeways between the cities.

Another objective of the invention is to provide a method for the creation of post-passivation interconnect metal that uses the application of a thick layer of dielectric such as polymer.

Another objective of the invention is to provide a method for the creation of post-passivation interconnect metal that uses the application of a thick layer of metal formed by selective electroplating.

Yet another objective of the invention is to provide a method that allows for the creation of long post-passivation interconnect lines, whereby these long post-passivation interconnect lines do not have high resistance or introduce high capacitance.

A still further objective of the invention is to create post-passivation interconnect lines that can carry high levels of current for the creation of power and ground distribution networks.

A still further objective of the invention is to create post-passivation interconnect metal that can be created using cost effective methods of manufacturing by creating the interconnect metal on the surface of and after a layer of passivation has been deposited.

In accordance with the objectives of the invention a new method is provided for the creation of post-passivation interconnect lines. Fine line interconnects are provided in a first layer of dielectric overlying semiconductor circuits that have been created in or on the surface of a substrate. A layer of passivation is deposited over the layer of dielectric; a thick second layer of dielectric is created over the surface of the layer of passivation. Thick and wide interconnect lines are created in the thick second layer of dielectric. Intra-chip drivers are connected to the thick, wide post-passivation interconnections.

DESCRIPTION OF THE PREFERRED EMBODIMENTS

U.S. Pat. No. 6,383,916, to a common inventor as the current invention, teaches an Integrated Circuit structure where re-distribution and interconnect metal layers are created in layers of dielectric over the passivation layer of a conventional Integrated Circuit (IC). A layer of passivation is deposited over the IC, a thick layer of polymer is alternately deposited over the surface of the layer of passivation, and thick, wide metal lines are formed over the passivation.

Figure 6A:
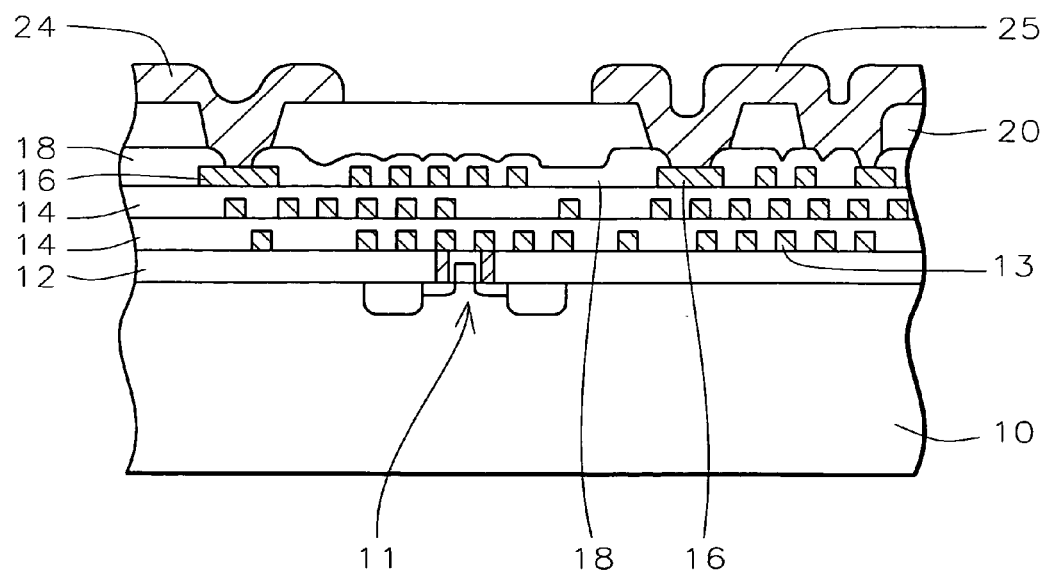
FIGS. 6a and 6b are cross-sections of the interconnect structure of the present invention including contact pads on top of the post-passivation interconnection structure for connection to external circuits through wirebonds, gold bumps and solder bumps.

Referring now more specifically to FIG. 6a, there is shown a cross section of one implementation of U.S. Pat. No. 6,383,916. The surface of silicon substrate 10 has been provided with transistors 11 and other devices (not shown in FIG. 6a). The surface of substrate 10 is covered by an interlevel dielectric (ILD) layer 12, formed over the devices.

Layers 14 (two examples are shown) represent all of the metal layers and dielectric layers that are typically created on the dielectric layer 12. Layers 14 contain multiple layers of dielectric or insulation and the like. Conductive interconnect lines 13 make up the network of electrical connections that are created throughout layers 14. Overlying and on the surface of layers 14 are points 16 of electrical contact. These points 16 of electrical contact can, for instance, be bond pads that establish electrical interconnects to external circuits. These points of contact 16 can be points of interconnect within the IC arrangement that establish electrical interconnects to the transistors and other devices in the surface of the substrate. These metal layers are referred to as fine line metal interconnections.

Typically, the intermetal dielectric (IMD) layers comprise silicon-based oxides, such as silicon dioxide formed by a chemical vapor deposition (CVD) process, CVD TEOS oxide, spin-on-glass (SOG), fluorosilicate glass (FSG), high density plasma CVD oxides, or the composite layer formed by a portion of this group of materials. The IMD layers typically have a thickness of between about 1000 and 10,000 Angstroms. The fine line metal interconnections are typically formed by sputtering aluminum or an aluminum alloy and patterning the aluminum to form the fine metal lines. Alternatively, the fine lines may be formed by a copper damascene process. In the copper damascene process, the copper is protected by an adhesion/barrier layer not only underlying the copper, but also surrounding the copper at the sidewalls of the line through the IMD. These fine lines typically have a thickness of between about 1000 and 10,000 Angstroms. In the fabrication process of the fine line metal interconnections, a typical clean room environment of class 10 or less is required; that is, having no more than 10 particles larger than 0.5 microns in any given cubic foot of air. For the generation of the 0.2 μm CMOS technology or more advanced generations, the clean room environment of class 1 or even better is required. The fine line IC metal is fabricated using 5X steppers or scanners or better and using a photoresist layer having thickness of less than 5 microns.

A passivation layer 18, formed of, for example, a composite layer of silicon oxide and silicon nitride or oxynitride (the thickness of silicon nitride or oxynitride is usually thicker than about 0.3 μm for the passivation purpose), is deposited over the surface of layers 14, and functions to prevent the penetration of mobile ions (such as sodium ions), moisture, transition metals (such as gold, copper, silver), and other contamination. The passivation layer is used to protect the underlying devices (such as transistors, polysilicon resistors, poly-to-poly capacitors, etc.) and the fine-line metal interconnection.

The key steps of U.S. Pat. No. 6,383,916 begin with the deposition of a thick layer 20 of an insulating polymer, preferably polyimide, which is deposited over the surface of passivation layer 18. Access must be provided to points of electrical contact 16; for this reason a pattern of openings is formed through the polyimide layer 20 and the passivation layer 18. Contact points 16 are, by means of the openings that are created in the layer 20 of polyimide, electrically extended to the surface of layer 20.

After formation of the openings, metallization is performed to create thick, wide metal lines 24 and 25 and to connect to contact points 16. Lines 24 and 25 can be of any design in width and thickness to accommodate specific circuit design requirements. The thick, wide metal of the post passivation metal lines of the invention is thicker then the typical fine-line metal layers by a ratio of between about 2 and 1000 times. The thick, wide metal lines are wider than the fine-line metal by a ratio of between about 2 and 1000 times. The thick, wide metal lines have a thickness of between about 2 and 100 µm, and a width of greater than or equal to about 2 µm. Line spacing preferably is greater than or equal to about 2 µm. This structure allows for the interconnection of circuit elements at various distances using the thick, wide (as compared to the underlying "fine line" metallization in layers 14) metal of 25.

Thick, wide metal 25 has smaller resistance and capacitance than the fine line metal 14 and is also easier and more cost effective to manufacture. The thick, wide metals lines are formed by a selective deposition process—by photoresist defined electroplating of metals. Gold and copper are preferred. Silver, palladium, and nickel are other possible choices. Optionally, a top layer of polymer (not shown in FIG. 6a) can also be formed to encapsulate the thick, wide metal 25.

In more detail, the clean room environment of the post-passivation metal process can be of a class 100 or more; that is, having 100 or more particles larger than 0.5 microns in any given cubic foot of air. For advanced applications, a clean room environment of class 10 may be required. During photolithography in the post-passivation metal process, aligners or 1X steppers are used with a photoresist having a thickness of greater than about 5 microns. The thick, wide metal lines have a thickness of between about 2 and 100 microns and a width of larger than about 2 microns.

An advantage of the selective deposition process of the invention is a minimization of wasted material, especially when precious metal, such as gold, silver, or palladium is used. In the selective deposition process, the metal is electroplated only where it is needed. In contrast, in the standard metal damascene process used for fine line metallization, metal is electroplated everywhere and then etched or polished away where it is not needed. Covering the whole wafer with thick metal creates stress which causes the process problem. This is a waste of metal, especially for the cases when precious metal is used. The removed metal is often contaminated and may not be able to be reused or may be very expensive to be reused.

Furthermore, in the selective deposition process of the invention, the thickness of selective electroplated metal is defined by the thickness of photoresist, which can be formed as thick as 100 microns. In other words, it is feasible and cost-effective to form thick metal by selective electroplating. By contrast, it is technically difficult to form thick metal by a damascene copper process. A primary limitation to forming thick copper damascene lines is the thickness of the chemical vapor deposited (CVD) oxides which define the damascene copper thickness. CVD oxides cannot be thickly deposited due to stress concerns. It is also very expensive to deposit thick CVD oxides.

After electroplating, the photoresist is removed. As shown in an enlarged illustration in FIG. 6e, the adhesion/barrier layer 22, comprising TiW, TaN, Cr, Ti, or TiN, and seed layer 23, comprising the same metal as the electroplated metal, are removed by etching using the electroplated metal layer 24 as a mask. During the self-aligned wet etching of the adhesion/barrier layer, an undercut 21 is formed in the adhesion/barrier layer 22, as shown in FIG. 6e. The undercut is usually between about 0.03 to 2.0 micron per side, depending on etching recipe and over-etch time.

The chip structure of the thick, wide post-passivation metal 24 and 25 is different from the chip structure of the fine line metallization. In addition to the undercut 21 in the adhesion/barrier layer, there is a clear boundary between the sputtered seed layer 23 and the electroplated metal 24 and 25. This can be seen, for example, in a transmission electron microscope (TEM) image. The entire metal body is constructed by two layers of materials having the same constitution (i.e. gold copper, silver, palladium, or nickel), but different microstructure. The grain size of the electroplated metal is much larger than that of the seed layer, by at least two times. For example, in a 1,000 Angstroms thick sputtered gold layer under a 4 microns thick electroplated gold layer, the grain size of the sputtered gold layer is about 1,000 Angstroms, and the grain boundary is perpendicular to the surface of substrate. The grain size of the electroplated gold is greater than about 2 microns with the grain boundary not perpendicular, and typically, at an angle of about 45 degrees from the substrate surface. In the fine line metal interconnections, there is no undercutting or clear boundary of grain size difference inside the aluminum layer.

The fine line metal lines can be copper damascene lines. Even if the post-passivation metal is also copper, the chip structure of the post-passivation metal lines is still different from the fine line metal lines. As described above, an undercut in the adhesion/barrier layer is formed during etching of that layer in the post-passivation metal process. Additionally, the adhesion/barrier layer 22 in the post-passivation metal structure is formed only under the copper line, as shown in FIG. 6e. In the copper damascene process of the fine line metallization, an adhesion/barrier layer is needed not only at the bottom, but also at the sidewalls of the copper line. This is needed primarily to protect the underlying active devices from copper ions. However, in the post-passivation scheme of the invention, the passivation layer 18 provides the barrier to copper ions.

Figure 6B:
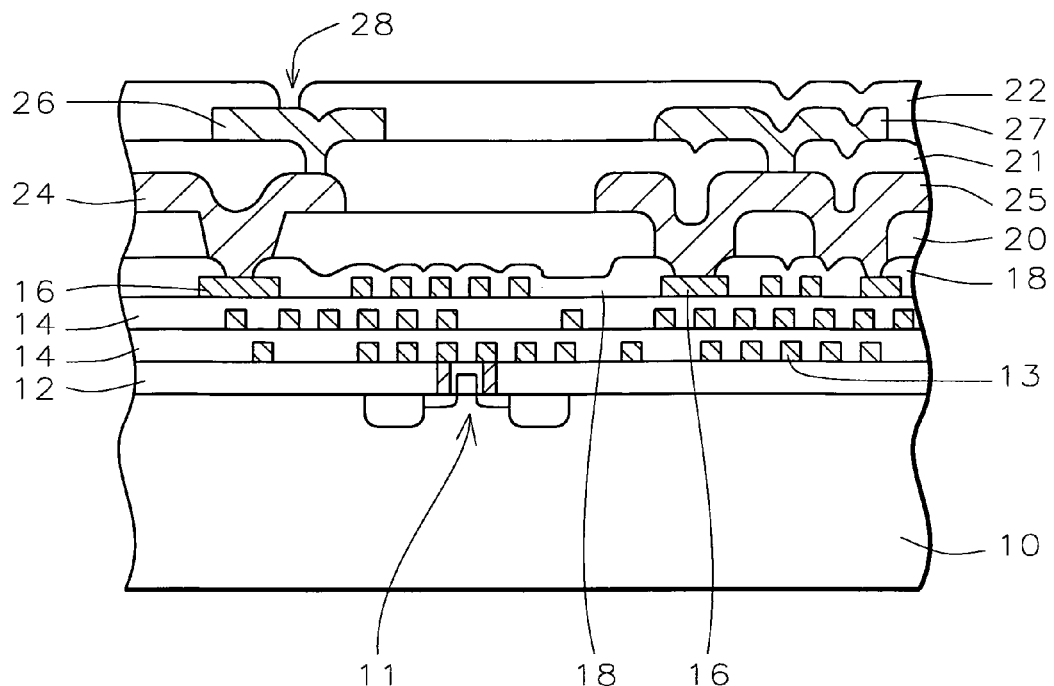

Referring now to FIG. 6b, multiple layers of post-passivation metals can also be built for some applications. A second layer of polymer 21 is deposited and patterned, followed by the formation of the second layer of thick, wide metal 26, 27 by selective deposition. A final encapsulation 22 covers the whole wafer with some exposed pads 28 for connection to external circuits. The exposed pads 28 are connected to external circuits through solder bumps, gold bumps, and/or wirebonds.

Figure 6C:
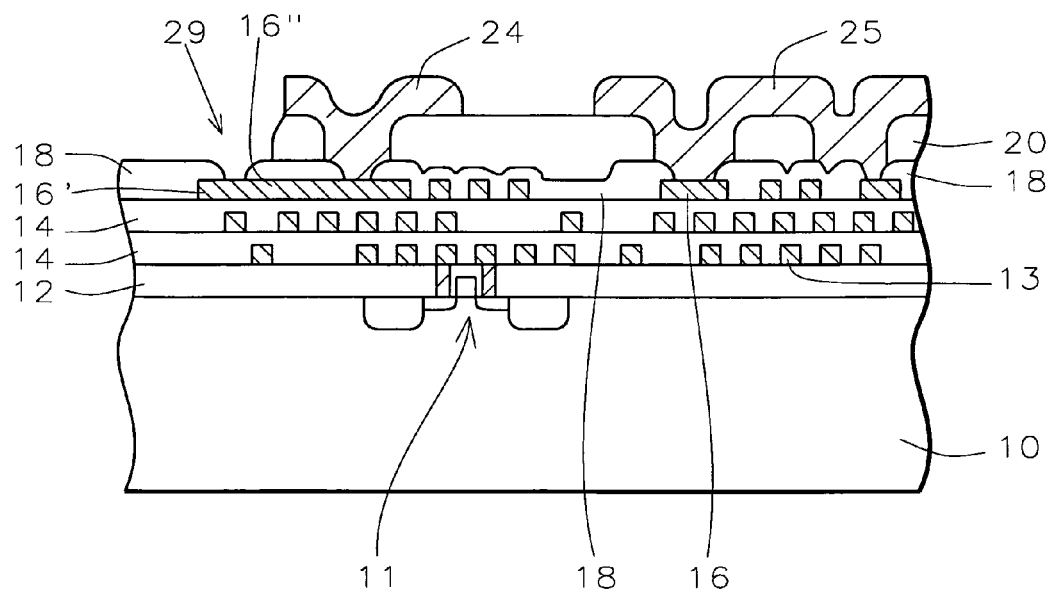
FIGS. 6c and 6d are cross-sections of the interconnect structure of the present invention including contact made to a conventional bond pad through the passivation layer rather than through a post-passivation thick wide metal system for connection to external circuits through wirebonds, gold bumps and solder bumps.
Figure 6D:
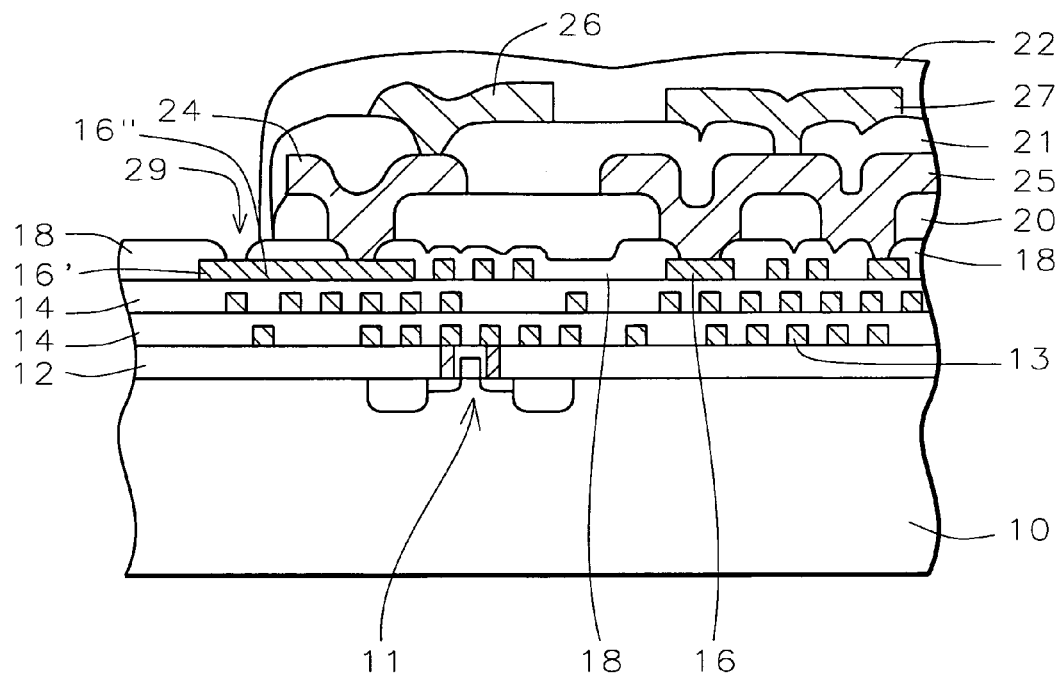
Figure 6E:
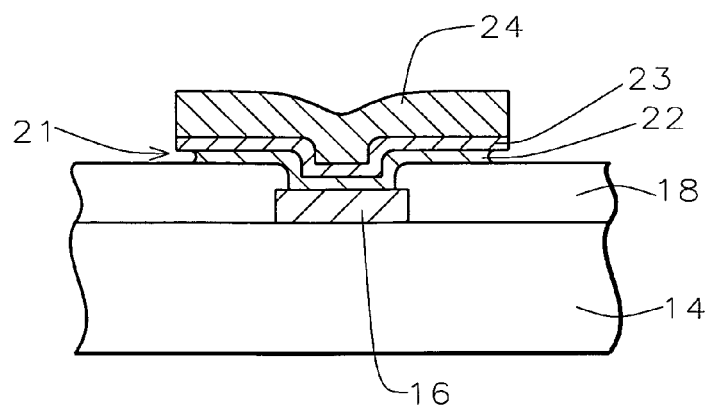
FIG. 6e shows details of metal structure in each layer of post-passivation interconnection structure.
Figure 6F:
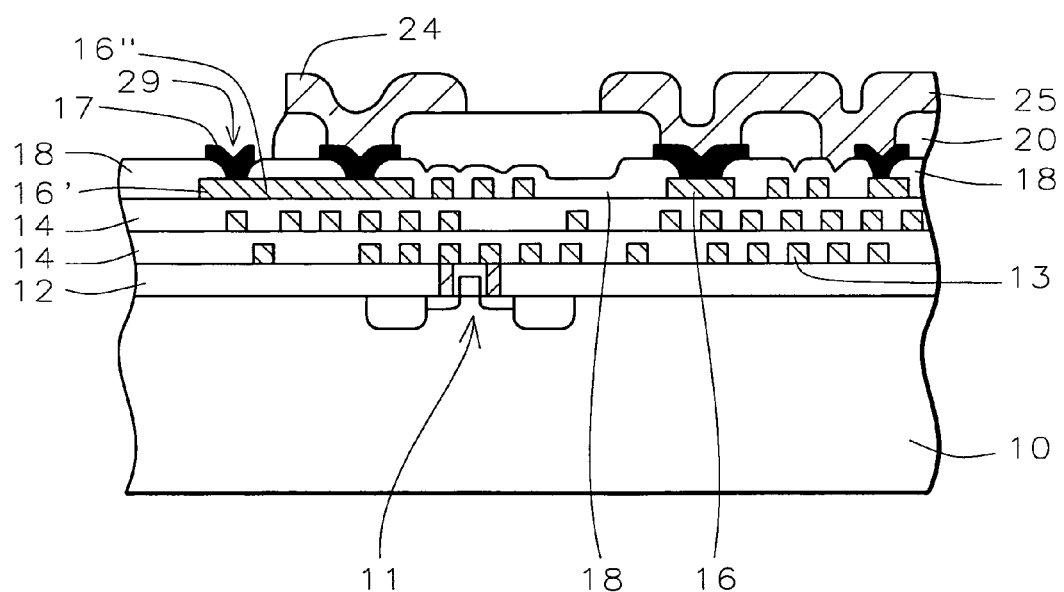
FIG. 6f is a cross section similar to FIG. 6c except that a metal cap is formed in the passivation openings. The metal cap is formed by aluminum or gold to protect the damascene copper used in the fine line metal scheme.

FIGS. 6c and 6d are analogous to FIGS. 6a and 6b, respectively, but show the process of the invention in conjunction with exposed pads on the top layer of the fine line metal structure for connection to the external circuits. Openings 29 have been made to aluminum pad 16. Conventional wirebonding techniques may be used to form wirebond connections to the original Aluminum pad 16 exposed by openings 29 in FIGS. 6c and 6d. Here, a piece of aluminum 16" is used for a short distance interconnection between wirebonding pads and the post-passivation interconnection. In some other applications, gold bump or solder bump connection may be used to connect contact pads 16' to external circuits. For the case when fine line metal 13 is formed by the damascene copper, as shown in FIG. 6f, a metal cap 17 is formed in the openings 29. The metal cap is formed by either aluminum or gold. Here, a piece of damascene copper 16" is used for a short distance interconnection between contact pads 16' and the post-passivation interconnection 24.

The following comments relate to the size and the number of the contact points 16 in FIGS. 6a–6d. Because these contact points 16 are located on top of a thin dielectric (layer 14, FIGS. 6a–6d) the pad size cannot be too large since a large pad size brings with it a large capacitance. In addition, a large pad size will interfere with the routing capability of that layer of metal. It is therefore preferred to keep the size of the pad 16 relatively small. The size of the contact pad 16 can be in the order of 0.5 μm to 40 μm, the exact size being dependent on the electrical requirements of the contacts.

The invention does not impose a limitation on the number of contact pads that can be included in the design; this number is not only dependent on package design requirements but is mostly dependent on the internal circuit design requirements. Layer 18 in FIGS. 6a–6d can be a typical IC passivation layer.

The most frequently used passivation layer in the present state of the art is plasma enhanced CVD (PECVD) oxide and nitride. In creating layer 18 of passivation, a layer of approximately 0.5 μm PECVD oxide can be deposited first followed by a layer of approximately thicker than about 0.3 μm nitride. Passivation layer 18 is very important because it protects the device wafer from moisture and foreign ion contamination. To achieve the passivation purpose, the silicon nitride is usually thicker than about 0.3 μm. The positioning of this layer between the sub-micron process (of the integrated circuit) and the tens-micron process (of the post-passivation metallization structure) is of critical importance since it allows for a cheaper process that has less stringent clean room requirements for the process of creating the interconnecting metallization structure.

Layers 20, 21, and 22 are thick polymer dielectric layers (for example polyimide) that have a thickness in excess of 2 μm (after curing). The range of the polymer thickness can vary from 2 μm to 150 μm, dependent on electrical design requirements.

For the deposition of layers 20, 21, 22 a polymer can be spin-on coated and cured. After spin-on coating, the polymer will be cured at 370 degrees C. for 1 hour in a vacuum or nitrogen ambient. For a thicker polymer, the polymer film can be multiple coated and cured. The polymer also can be formed by screen printing.

A polymer such as a polyimide (HD Microsystems, Parlin, N.J.) can be used as the polymer. Another material that can be used to create layers 20, 21, 22 is the polymer benzocyclobutene (BCB) (Dow Chemical Company, Midland, Mich.), which has recently gained acceptance to be used instead of typical polyimide application. Other possible materials for layers 20, 21, 22 include a silicone elastomer, or parylene. The epoxy-based material such as photoepoxy SU-8 (Sotec Microsystems, Renens, Switzerland) can also be used.

The thick layers 20, 21, 22 of polymer can be coated in liquid form on the surface of the layer 18 of passivation or it can be laminated over the surface of the layer 18 of passivation in dry film form.

For the thick layers 21, 22 of polymer, steps and dips exist in the polymer layer at the edge and gaps, respectively, of the underlying thick metal. Polymer like polyimide is usually a good planarization material, especially in filling small metal gaps. However, the degree of planarization is not 100%. For post-passivation thick metal, the intermetal polymer layer may require a planarization process. The polymer layers can be planarized by the chemical-mechanical polishing (CMP). Planarization can be immediately after depositing each intermetal polymer layer or before forming each layer of post-passivation metallization and after forming openings in the intermetal polymer layer.

Additional electrical components such as an inductor, a capacitor, and the like, not shown, can be created on the surface of layer 20 or 22 of polyimide and in electrical contact with underlying metallization.

Figure 1:
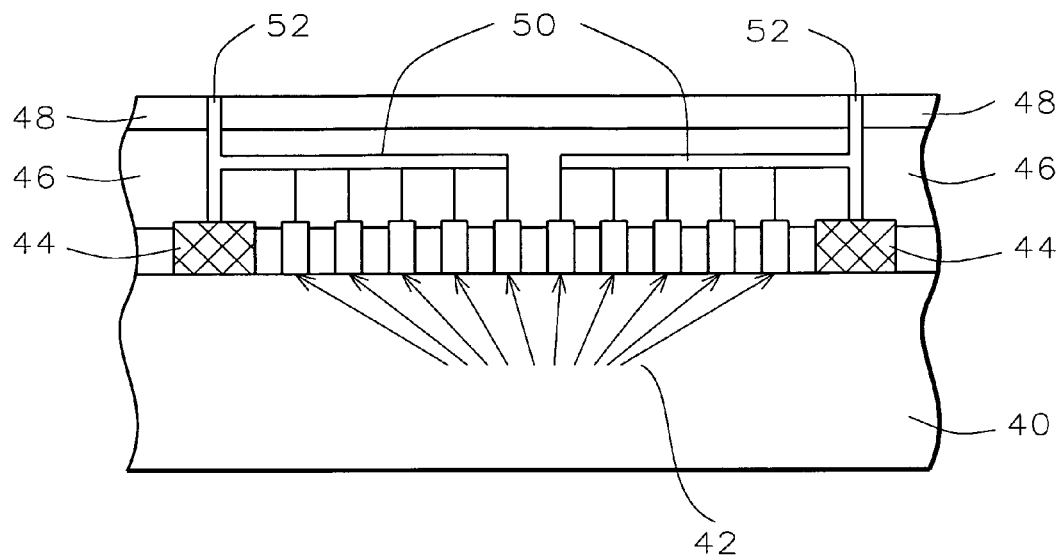
FIG. 1 is a representation of a silicon substrate over which a prior art fine-line interconnect network is created over which a layer of passivation is deposited, and power and/or ground pads are provided through the layer of passivation for external connection. The chip structure that is shown in FIG. 1 addresses prior art power and ground distribution networks.
Figure 2:
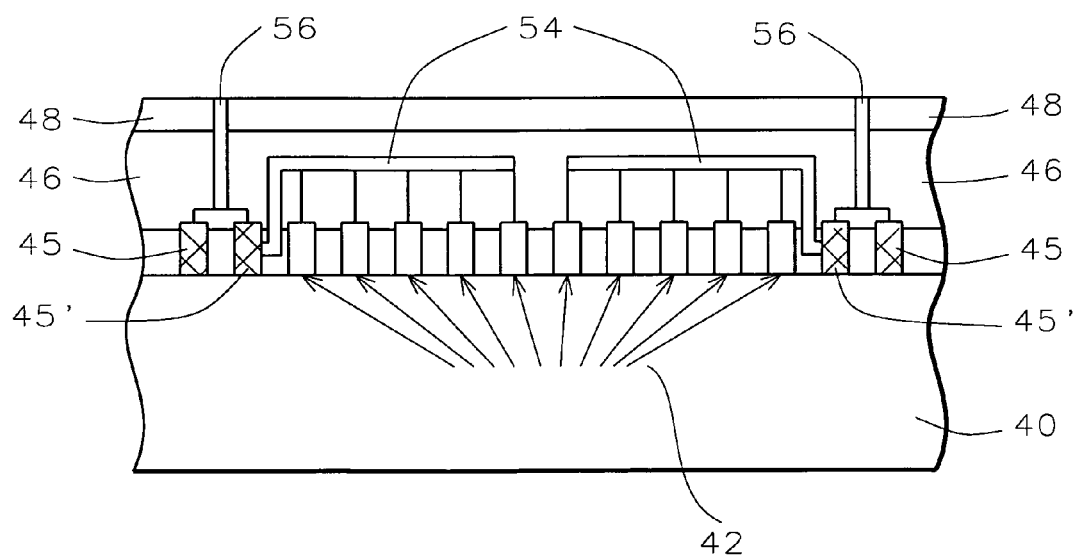
FIG. 2 is a representation of a silicon substrate over which a prior art fine-line interconnect network is created over which a layer of passivation is deposited, and clock and/or signal pads are provided through the layer of passivation for external connection. The chip structure that is shown in FIG. 2 addresses prior art clock and signal distribution networks.
Figure 3A:
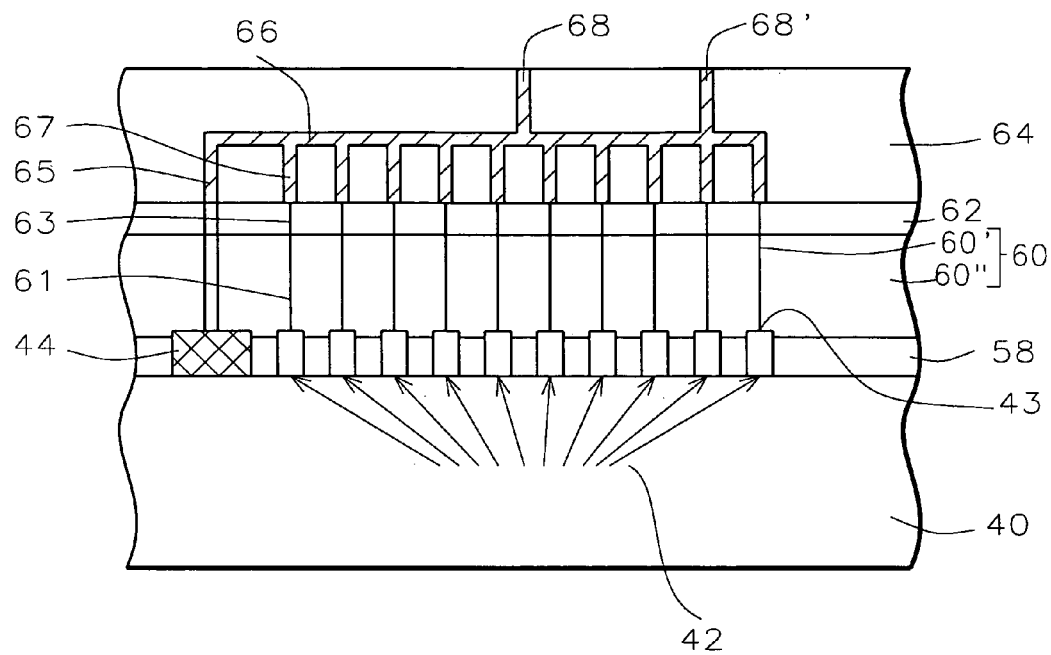
FIG. 3a is a representation of a silicon substrate over which an interconnect network is created according to the invention. Power and/or ground pads are provided for external connection. The chip structure that is shown in FIGS. 3a and 3b relates to power and ground distribution networks of the invention. 66 represents one or more than one layers of metal.

Now, the design architecture of the present invention will be described in detail. Referring now specifically to FIG. 3a, this figure refers to power and ground architecture. There is shown in FIG. 3a a silicon substrate 40 over which an interconnect network 60 is created according to the invention, with a wide and thick post-passivation wire interconnect network 66 created in a thick layer 64 of dielectric overlying a layer 62 of passivation. A power and/or ground pad can be provided for external connection. Following are the various features that are shown in FIG. 3a:

- 40 is the silicon substrate on the surface of which interconnect lines are created in accordance with the invention.
- 42 are semiconductor circuits that are created in or on the surface of substrate 40. These may be n-channel MOS device, p-channel MOS devices, and/or CMOS devices. Each semiconductor circuit has several nodes connected to other circuits or power/ground. A typical circuit consists at least a power node, Vdd, a ground node, Vss, and a signal node, Vs.
- 43 is the power (Vdd) or ground node (Vss) of the semiconductor circuits 42.
- 44 is an ESD circuit that is provided for the protection of circuits 42.
- 58 is a layer in or on the surface of substrate 40 where semiconductor circuits 42 are created.
- 60 is a layer of fine-line interconnects, formed in one or more layers of metal 60' and dielectric 60", that has been created overlying semiconductor circuit layer 58 and connected to the semiconductor devices 42.
- 61 is a connection comprising metal formed through a via through one or more dielectric layers 60"; more such vias are shown in FIG. 3a but are, for reasons of simplicity, not highlighted.
- 62 is a layer of passivation that has been deposited overlying the layer 60 of fine-line interconnects.
- 63 is one of the vias that passes through layer 62 of passivation; more such vias are shown in FIG. 3a but are, for reasons of simplicity, not highlighted.
- 64 is a layer of dielectric in which, as a post-passivation process, interconnects, in one or more layers of metal, have been created.
- 65 is a power or ground via that is connected to the ESD circuit 44, originating in layer 64 and further passing through layers 62 and 60". This connection comprises metal formed through vias in the dielectric layers 64, 62 and 60".

66 represents the combined (for multiple connection scheme in layer 64) power or ground bus or plane. This layer could be one or more than one thick, wide post-passivation metal layers as well as intervening dielectric including a polymer. For multiple layers of metal, the metals are connected through openings in the polymer.

67 is a via that is created in layer 64 and overlying the openings in layer 62 of passivation and of layer 60Δ. The power or ground bus or plane is connected to the semiconductor circuits 42 through metals formed in the openings in layer 64, 62 and 60Δ. More such vias are shown in FIG. 3a but are, for reasons of simplicity, not highlighted.

68 is the contact point on the top of the post-passivation interconnection scheme. The contact point 68 is connected to the external power supply through solder bumps, gold bumps, or wirebonds.

68' is an additional (optional) contact point on the top of the post-passivation interconnection scheme. The contact point 68', in addition to the contact point 68, may be added at a location to fit in specific packaging requirements, and to reduce further IR drop for the nearby semiconductor circuits. The contact point 68' is also connected to the external power supply through solder bumps, gold bumps, or wirebonds.

From the representation that is shown in FIG. 3a, it is clear that, most importantly, the ability to create interconnects to semiconductor devices 42 that have been created in or on the surface of a substrate 40 has been extended by creating these interconnects not only as fine-line interconnects in layer 60 but extending the interconnect by creation of a wide, thick post-passivation wire interconnect network 66 overlying a layer 62 of passivation. This provides immediate and significant benefits in that these lines are further removed from the surface of the substrate 40 (reducing parasitic influences by the interconnect lines 60' on the semiconductor devices 42 that are created in or on the surface of the substrate 40) while the interconnect network 66 that is created overlying the layer 62 of passivation can now contain sturdier; that is, thicker and wider, post-passivation interconnect lines 66. The thick, wide metal interconnects 66 can be used for power and ground distribution; this distribution then takes place above a layer 62 of passivation and partially replaces and extends the conventional method of having for these purposes a fine-line distribution interconnect network 60 under the layer 62 of passivation.

Some points of interest can be listed at this time as they relate to prior art methods and to the invention.

Prior Art:
provides an ESD circuit for each pad that is connected to external power supply. In other words, the ESD circuit must be close to the pad connected to external power supply. In case that the pad is far away from the ESD circuit, the pad and the ESD circuit are connected to each other by the fine metal line. The metal line will be burned during the power surge, because the load of metal line (high metal resistance and capacitance) is too high.

provides, in parallel to the ESD circuits, a fine-line interconnect network for further distribution of the power and ground stimuli, and the fine-line power and ground distribution network is created underneath a layer of passivation. There is significant IR drop and power/ground noise due to the high resistance and high capacitance of fine-line interconnect network.

In this respect and related to the above provided comments, it must be remembered that power and ground pads do not require drivers and/or receiver circuitry.

The Invention:
does not need to create an ESD circuit for each pad that is connected to external power supply. That is, more than one pad can be connected to external power supply by sharing one ESD circuit. It also implies that the ESD circuit can be located at a distance from the pad connected to external power supply. In view of the more robust wiring (low load due to low resistance and low capacitance) that drives the ESD circuit, the design architecture results in reduced power loss by an unexpected power surge over the interconnect line, resulting in more power being delivered to the ESD circuit, and allows for the power and ground interconnects to be directly connected to the power and ground nodes of the internal circuits of a semiconductor device, this either without an ESD circuit or with a smaller than regular ESD circuit (as previously explained).

the post-passivation power and ground distribution network is created above a layer of passivation. There is no significant IR drop and power/ground noise due to the low resistance and low capacitance of post-passivation interconnect network.

The method that is used to create the interconnect network that is shown in FIG. 3a addresses only the use of power and ground connections. FIG. 3a can be summarized as follows: a silicon substrate 40 is provided in the surface of which have been created semiconductor devices 42 and at least one electrostatic discharge (ESD) circuit 44; one or more layers 60" of dielectric are deposited over the substrate 40; a fine-line interconnect network 60 is created in the dielectric layers 60" making contact with the active circuits 42 and the ESD circuit 44. A layer 62 of passivation is deposited over the fine-line interconnect network 60. Openings 63 are created in the layer 62 of passivation that aligns with points of contact in the top layer of the fine-line interconnect network 60. A thick layer of dielectric is optionally deposited over the layer 62 of passivation. An adhesion/barrier layer and a seed layer are deposited over the whole substrate 40. A thick photoresist layer is deposited to a thickness greater than the desired bulk metal thickness. Conventional lithography is used to expose the seed layer in those areas where electroplating thick, wide metallization 66 is desired. Thus, a wide thick line post-passivation interconnect network 66 is created by selective deposition in the layer 64 of dielectric, contacting the ESD circuits 44 and the internal circuits 42. A point of electrical 68, 68' contact comprising a power or ground contact is provided in the surface of the thick layer 64 of dielectric.

A selective deposition process forms the post-passivation metal lines 66. An advantage of the selective deposition process of the invention is a minimization of wasted material, especially when precious metal, such as gold, silver, or palladium is used. In the selective deposition process, the metal is electroplated only where it is needed. In contrast, in the standard metal damascene process used for fine line metallization, metal is electroplated everywhere and then etched or polished away where it is not needed. This is a waste of expensive metal, especially for the cases when precious metal is used. The removed metal is often contaminated and may not be able to be reused or may be very expensive to be reused.

Figure 3B:
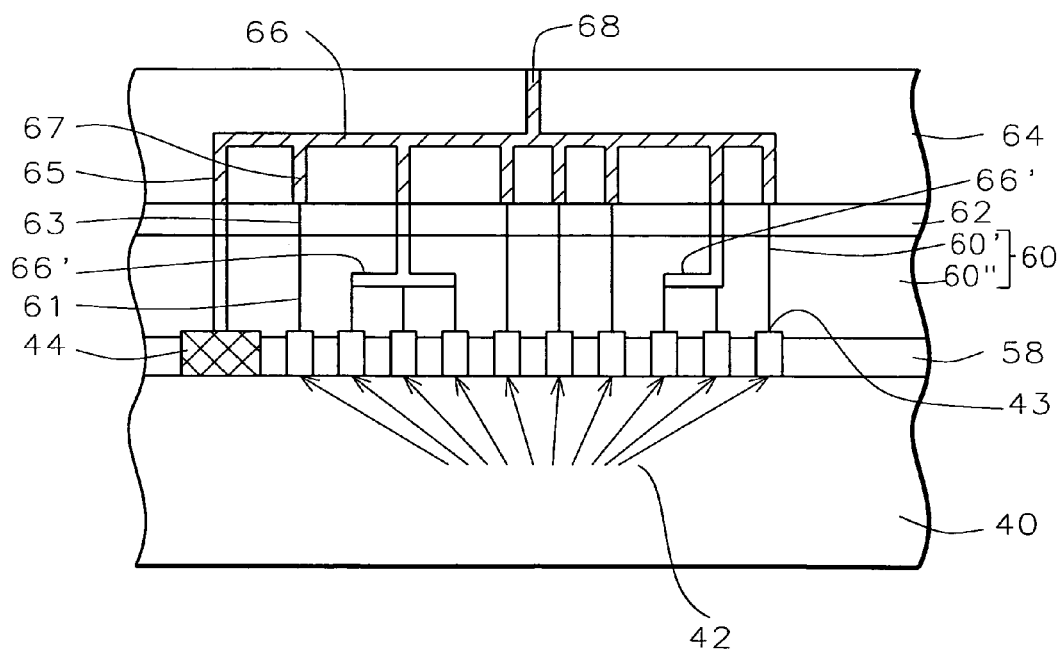
FIG. 3b further distributes the power and ground to the circuit nodes through power and ground distribution lines that are below a layer of passivation and power and ground distribution lines that are above a layer of passivation. 66 and 66' each represent one or more than one layer of metal.

FIG. 3b provides further insight into the creation of the power and ground post-passivation interconnect lines of the invention whereby these interconnect lines have been shown as thick, wide interconnect lines 66 and fine line interconnect lines 66'. Post-passivation thick interconnect lines 66 have been created above the layer 62 of passivation and act as global power and ground interconnect lines. Fine line interconnect lines 66' have been created below the layer 62 of passivation and act as local power and ground interconnect lines. Again thick, wide interconnect line 66 represents the combined (for multiple connection scheme in layer 64) power or ground bus or plane. This could be one or more than one thick, wide post-passivation metal layers 66 as well as intervening dielectric 64 including a polymer. For multiple layers thick, wide interconnect layers 66 of metal, the metals layers 66 are connected through openings in the polymer. Metal scheme 66' represents the combined (for multiple connection scheme in layer 60" of dielectric) power or ground bus or plane. This could be one or more than one fine-line metal layers 66' as well as intervening dielectric usually including a silicon-based oxide. For multiple layers 66' of fine-line metal, the fine-line metals layers 66' are connected through openings in the silicon-based inter-metal dielectrics. Alternately, if the current is large, wide metal lines 66 can be used in the fine-line interconnect network 60.

Figure 3C:
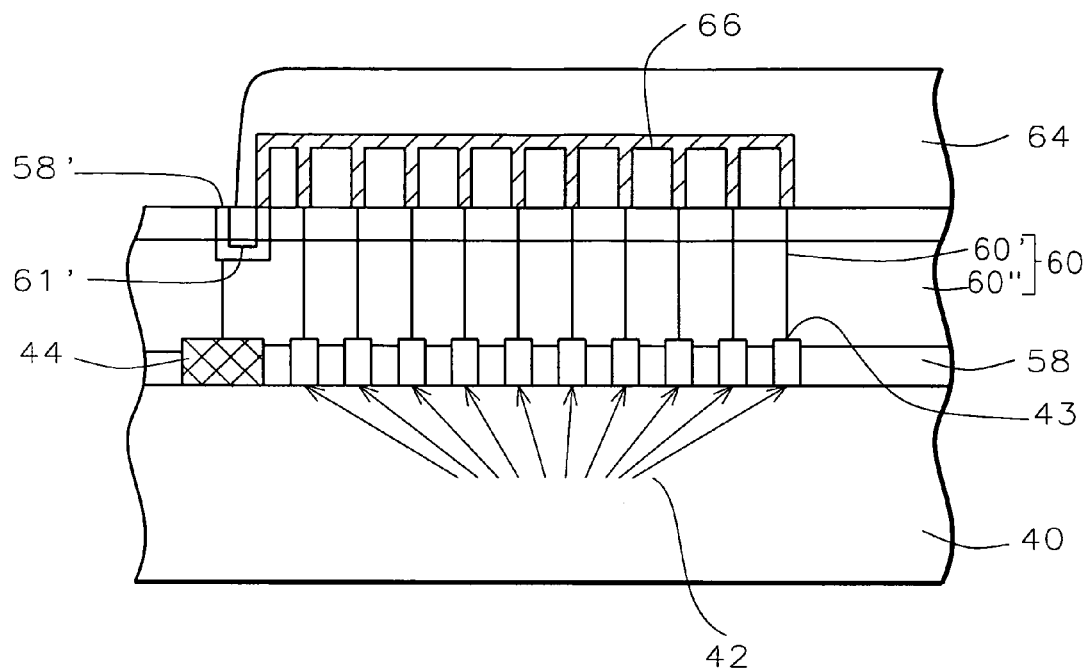
FIG. 3c shows an alternative wherein contact is made to a conventional bond pad through the passivation layer rather than through a post-passivation thick wide metal system.

FIG. 3c provides an alternative in which contact is made to a conventional aluminum metal layers 61', for example, through the passivation layer 62 rather than making contact to the post-passivation thick, wide metal system 66. The top layer of metal layers 61' is used for contact pad purposes and for connection between the contact pad 58' and the wide, thick interconnect lines 66. The distance of metal layers 61' is a short distance; for example, <500 µm in length. The contact pad 58' can then be connected to external circuits through wirebonds, gold bumps and/or solder bumps.

In the process of the present invention, in all aspects shown in the figures, the post passivation metallization can optionally be performed directly on the passivation layer 62 without the intervening polymer insulating layer. Although the insulating polymer layer provides distinct advantages, it may be desirable to remove the insulating polymer layer in order to save costs.

Figure 4A:
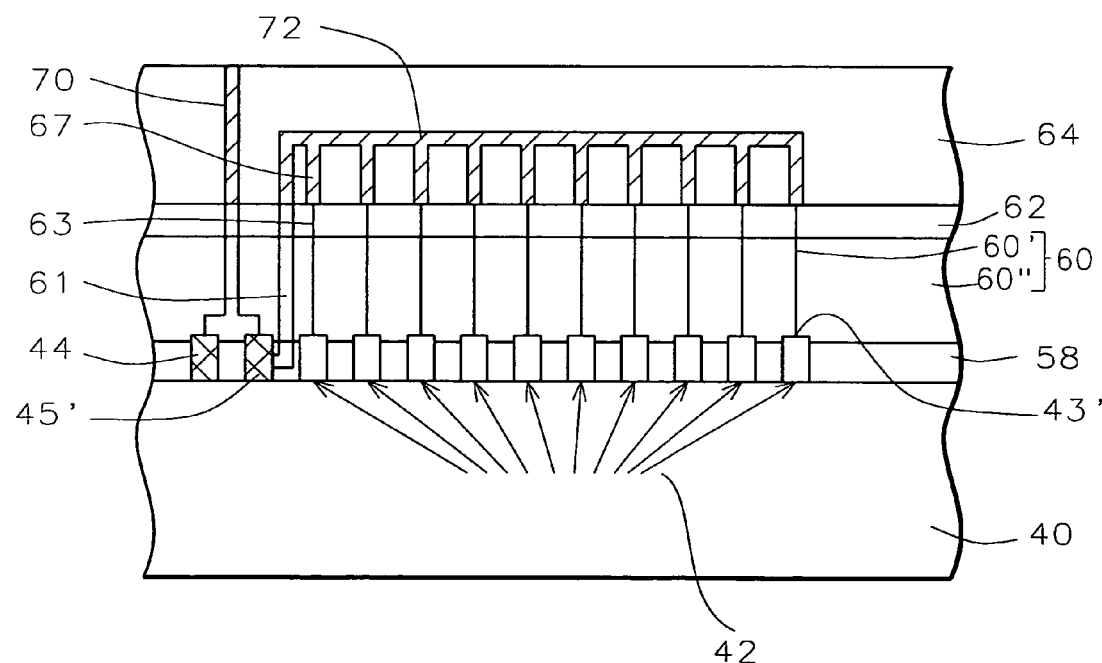
FIG. 4a is a representation of a silicon substrate over which an interconnect network is created according to the invention. An ESD and/or driver and/or receiver circuit access pad is provided through the surface of the layer of dielectric for external connection. The chip structure that is shown in FIGS. 4a and 4b addresses clock and signal distribution networks of the invention. "Signals" refer to, but are not limited to, address and data. 72 in the figure represents one or more than one layer of metal.

Referring now to FIG. 4a, FIG. 4a addresses the interconnections of signal and clock line. Signal here includes address, data, logic, and analog signals. Signal also includes the power/ground voltage output from voltage regulators. In FIG. 4a there is shown a cross section of a silicon substrate 40 over which an interconnect network is created according to the invention. An access pad 70 to an ESD circuit 44 or driver or receiver circuits or I/O circuits 45' is provided through the surface of the layer 64 of dielectric for external connection. While an ESD circuit 44 is required for all circuits to which an I/O connection is established and independent of the type of circuit to which the I/O connection is established, the I/O interconnect can also be provided to a receiver circuit or a driver circuit or an I/O circuit 45.

The features not previously highlighted that are shown in FIG. 4a are:
- 43' is now the signal node of the internal semiconductor circuits 42. The control, data, address signals or stimuli are input or output from the signal node 43'.
- the invention provides an interconnect network 72 comprising wide, thick post-passivation interconnect lines for distribution of the clock and signal stimuli,
- the invention creates an interconnect network 72 of thick, wide post-passivation interconnect lines for the clock and signal stimuli overlying a layer 62 of passivation,
- 70 is an external connection (pad) that is provided for the ESD circuit 44 and for driver/receiver/I/O circuit 45'; pad 70 provides external access for clock and signal stimuli to circuits 44 and 45', and
- 72 is a clock or signal bus that is created in the dielectric layer 64 using thick, wide post-passivation wires for interconnect lines 72; it must be noted that the clock and signal interconnect line distribution is entirely contained within the dielectric layer 64 without providing an external point of I/O interconnect.

The method that is used to create the interconnect network 72 that is shown in cross section in FIG. 4a can be summarized as follows. A silicon substrate 40 is provided; active circuits 42 have been created in the surface of the substrate 40 including an ESD circuit 44, receiver, driver and I/O circuit 45. First layers 58 of dielectric of inorganic material are deposited over the substrate 40 and a fine-line interconnect network 60' is created in the layers 60" of dielectric, making contact with the active circuitry. A layer 62 of passivation is deposited over the first thin layers 60" of dielectric; openings 63 are made through the passivation layer 62 to align with points of electrical contact in the surface of the first layers of dielectric. One or more thicker layers 64 of dielectric are deposited over the surface of the layer 62 of passivation, typically of an organic material; a wide thick line post-passivation interconnect network 72 is created in the thicker layer 64 of dielectric by selective deposition, making electrical contact with the metal pads under the layer 62 of passivation, including to the one ESD circuit 44, receiver, driver or I/O circuit 45'. A point of electrical contact is provided in the surface of the second layer of dielectric to the ESD circuit 44, receiver, driver or I/O circuit 45'.

Figure 4B:
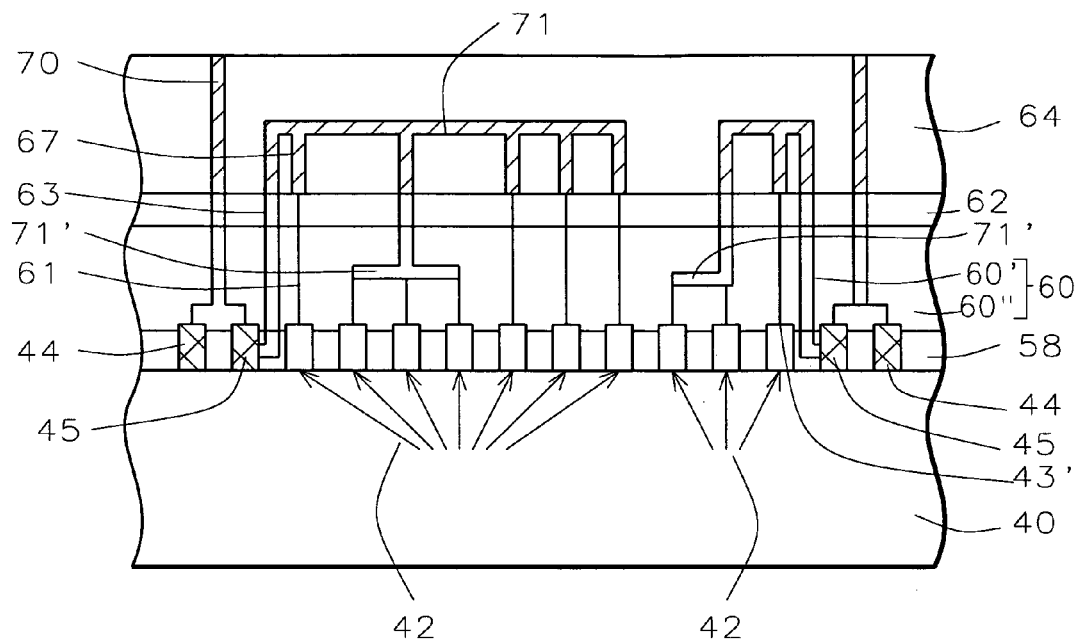
FIG. 4b further distributes signal and clock to the circuit nodes through clock and signal distribution lines that are below a layer of passivation in addition to clock and signal distribution lines that are above a layer of passivation. 71 and 71' each represent one or more than one layers of metal.

FIG. 4b provides further insight into the creation of the signal and clock post-passivation interconnect lines of the invention whereby these interconnect lines have been shown as thick, wide interconnect lines 71 and fine line interconnect lines 71'. Post-passivation interconnect lines 71 have been created above the layer 62 of passivation and act as global signal and clock interconnect lines. Fine line interconnect lines 71' have been created below the layer 62 of passivation and act as local signal and clock interconnect lines. Furthermore, internal circuits 42 have no driver, no receiver, and no ESD connections.

Figure 4C:
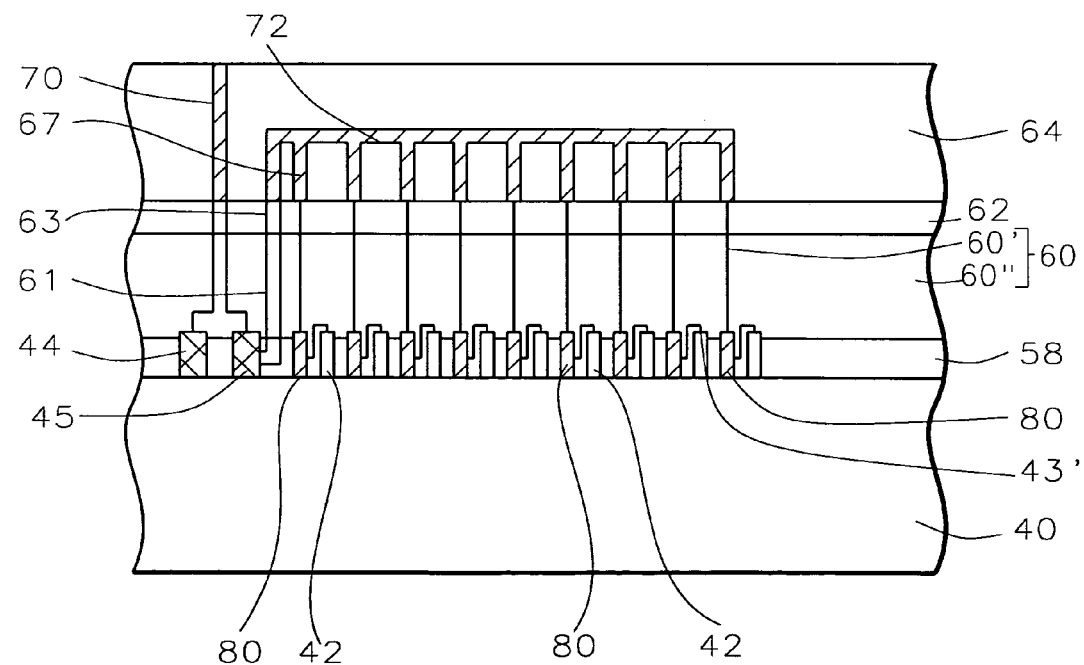
FIGS. 4c and 4d show smaller intra-chip circuit drivers.
Figure 4D:
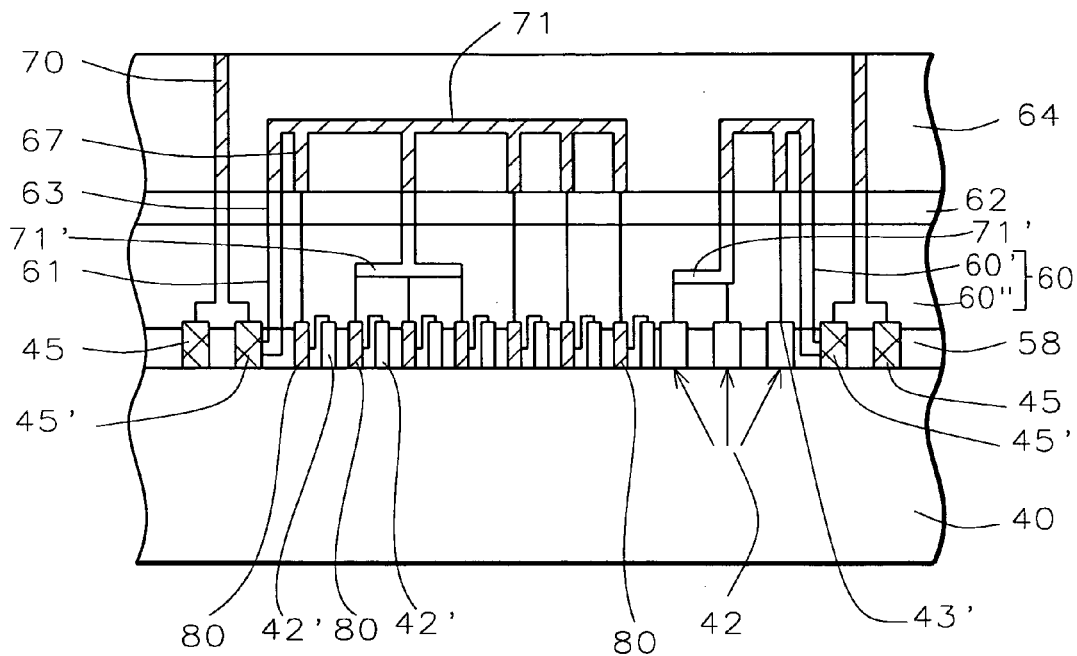
Figure 4E:
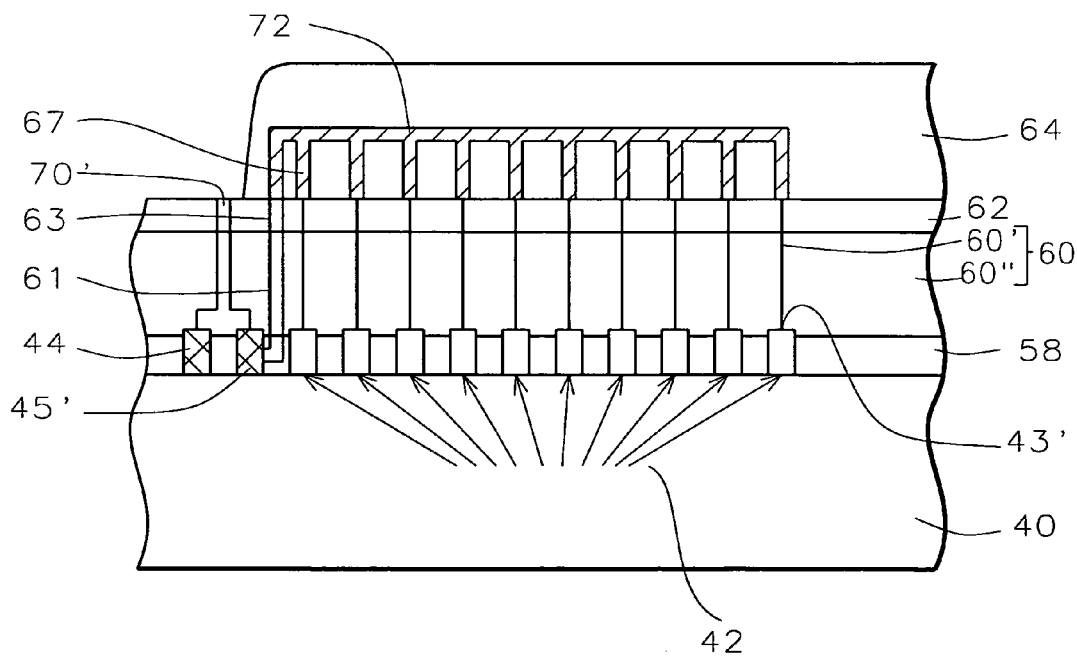
FIGS. 4e through 4h show an alternative for the embodiments in FIGS. 4a to 4d, respectively, wherein contact is made to a conventional bond pad through the passivation layer rather than through a post-passivation thick wide metal system.
Figure 4F:
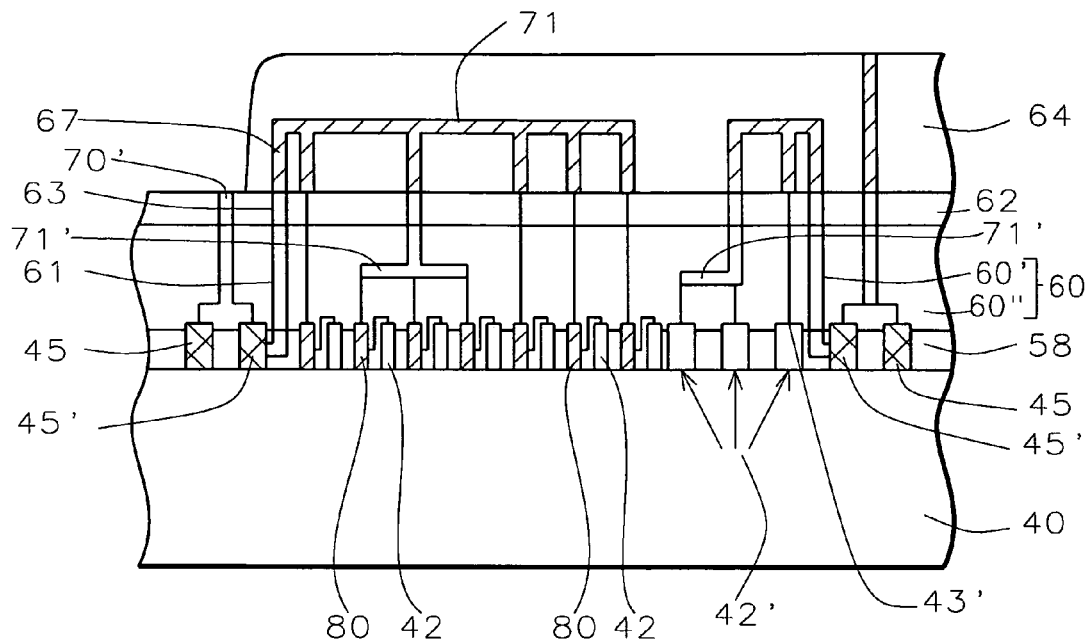
Figure 4G:
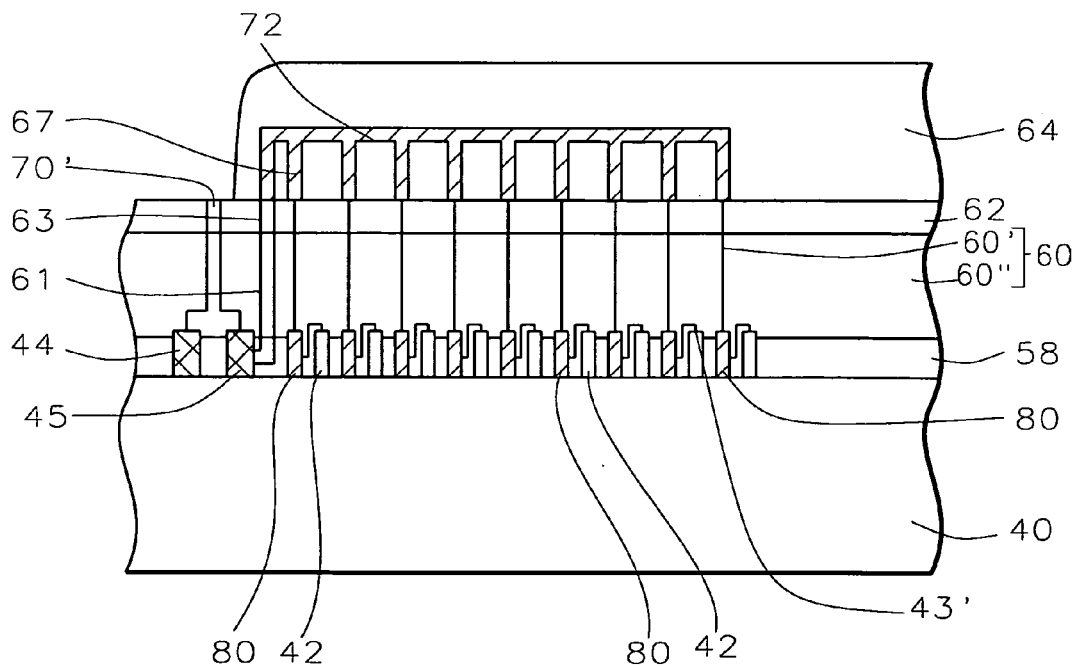
Figure 4H:
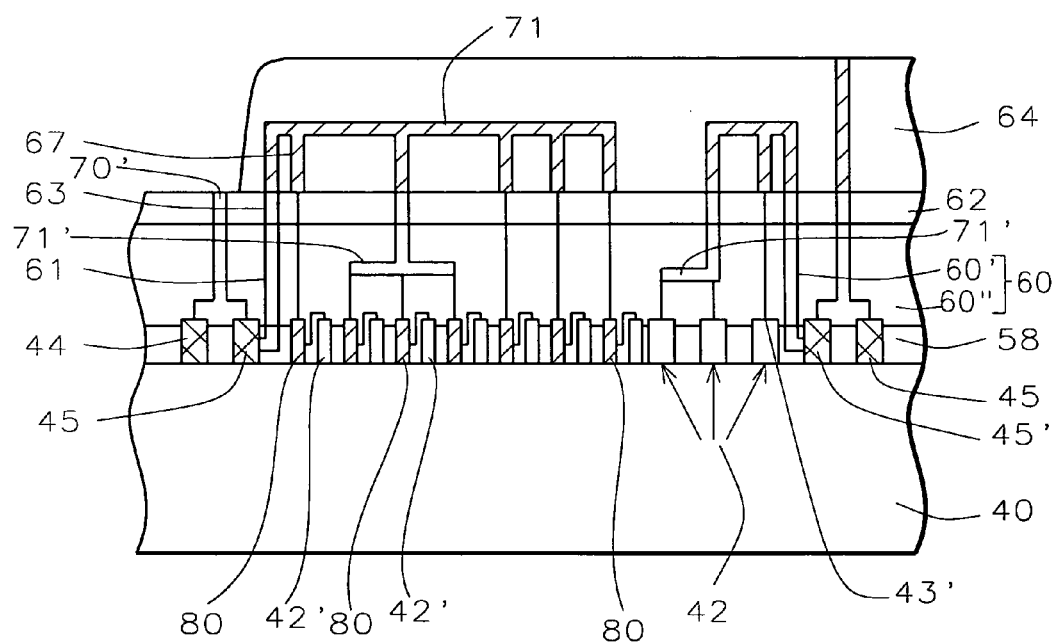

Intra-chip drivers and receivers may be necessary if the interconnection distance is long and/or the load of the net of circuits is large. A driver circuit is used to drive a load; i.e., to charge up the capacitance of a net formed with circuits and interconnects by the drive current. A driver current is the output of a driver circuit. The ability to drive current is proportional, in CMOS devices, to the W/L ratio, where W/L is the ratio of the device channel width to its length. These intra-chip drivers are typically smaller than off-chip I/O drivers. For the ability to detect a signal level, the sensitivity of a receiver is dependent on the sensing amplifier, or latched input circuits, or cascade stages. The intra-chip receiver requires smaller sensing amplifiers, or latched circuits, or fewer stages of cascade circuits as compared to the off-chip receivers. Intra-chip drivers and receivers 80 are shown in FIGS. 4c and 4d. Intra-chip circuits 80 typically have no ESD circuits and no I/O circuits. For short distance on-chip interconnection, no intra-chip circuits may be required. FIG. 4d shows an example of internal circuits 42' that need to utilize attached intra-chip drivers or receivers 80 while internal circuits 42 do not require attached intra-chip drivers or receivers 80.

Further Provided are:
- 45 are two ESD circuits that are provided in or on the surface of the substrate 40; ESD circuits 45 are always required for any external connection to an input/output (I/O) pad 70
- 45' which are circuits that can be receiver or driver or I/O circuits for input (receiver) or output (driver) or I/O purposes respectively. These are off-chip drivers or receivers or I/O circuits 45'. Contact pads 70 to the off-chip drivers, receivers, or I/O circuits 45' may be far from the ESD circuits 44. They may be between about 100 microns to 1 millimeter away from the ESD circuits 44. Furthermore, off-chip contact pads 70 may be between about 200 microns to 1 millimeter away from each other.

Intra-chip circuits are usually smaller than the off-chip drivers. The intra-chip driver circuits are different from the off-chip circuits in that they have no I/O circuits and no ESD circuits. FIGS. 4c and 4d show smaller internal driver circuits 80 connected to the internal circuits 42. Driver/receiver/I/O circuit 45' are larger than off-chip circuits.

In FIGS. 4a, 4b, 4c, and 4d, the connection to external circuits is made through pad 70 formed and exposed on the top of the post-passivation metal structure. The connection to external circuits can be made through solder bumps, gold bumps and/or wirebonds. In some applications, as shown in FIGS. 4e, 4f, 4g, and 4h, the connection to external circuits can be made on a conventional aluminum metal 70', for example, through the passivation layer 62 rather than making contact to the post-passivation thick, wide metal system, as show in FIGS. FIGS. 4e, 4f, 4g, and 4h describe the similar design architecture as in FIGS. 4a, 4b, 4c, and 4d, respectively, except that pads for connection to external circuits are at different structure levels.

Figure 4I:
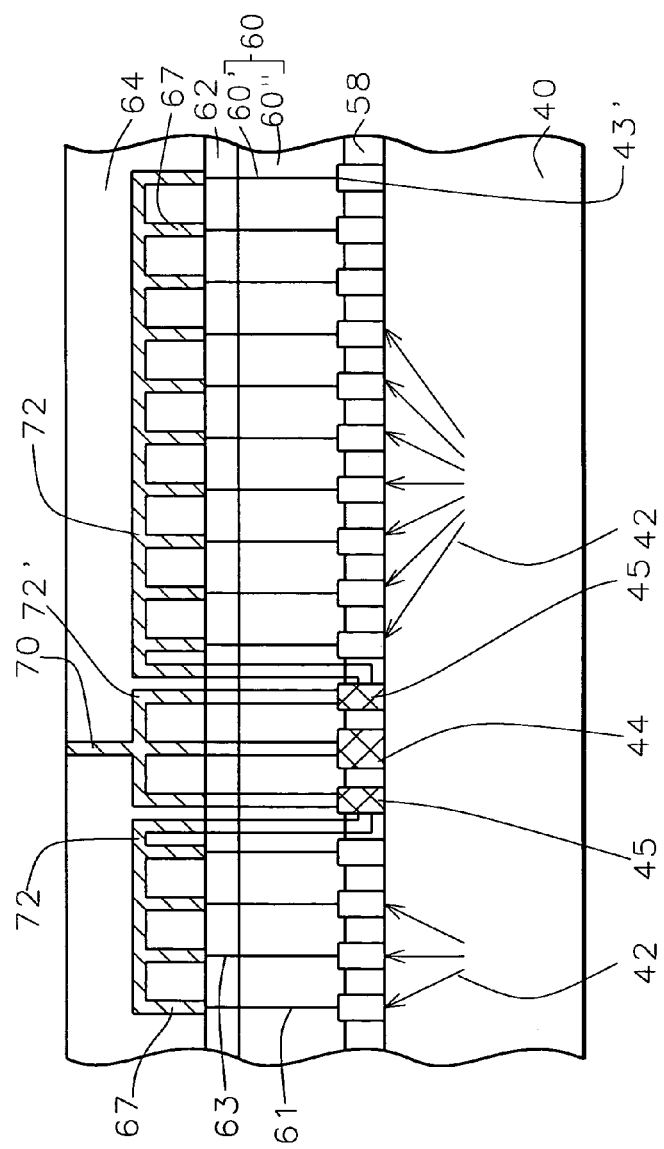
FIG. 4i shows two drivers, receivers or I/O circuits sharing a common ESD circuit by using the post-passivation interconnect to connect the drivers, receivers or I/O circuits to the common ESD circuit.
Figure 4J:
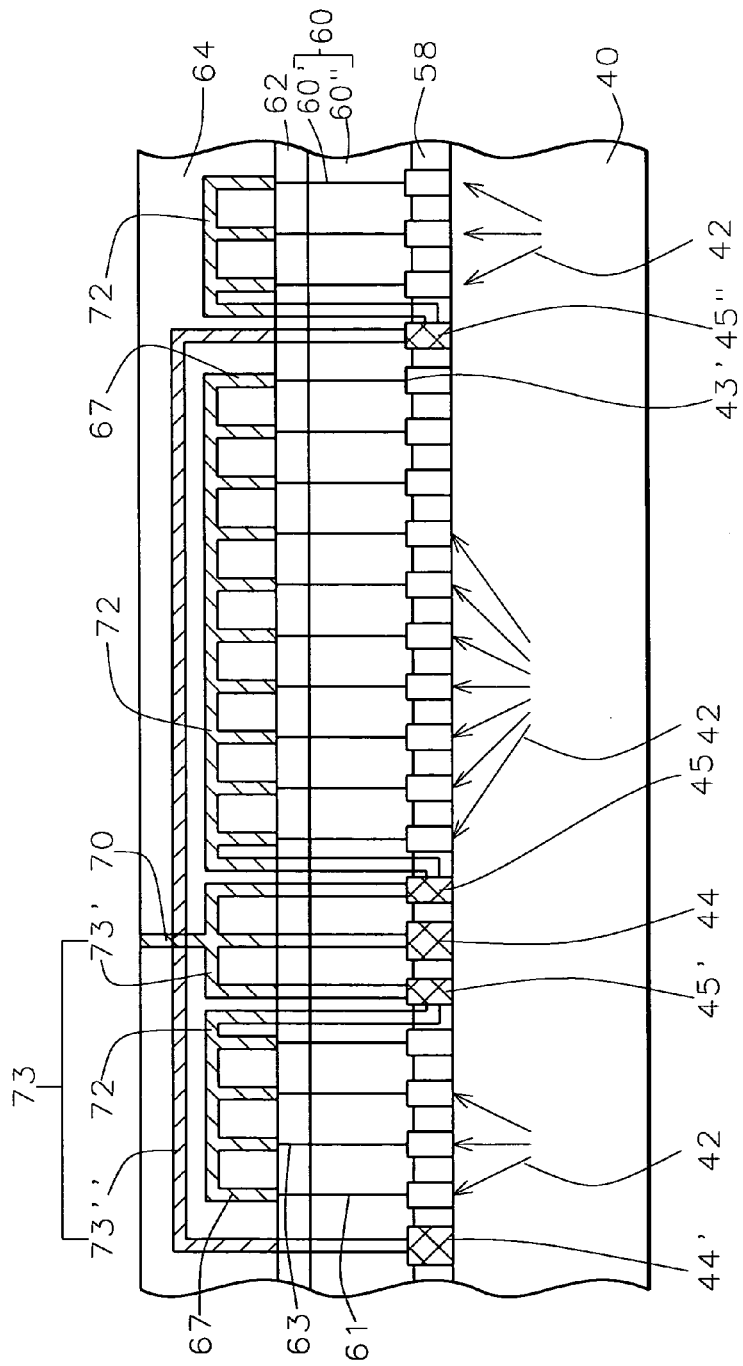
FIG. 4j shows multiple (more than two) drivers, receivers, and/or I/O circuits connected to multiple ESD circuits (more than one) using low-impedance post-passivation interconnects.

FIG. 4i shows two drivers, receivers or I/O circuits 45 sharing a common ESD circuit 44 by using the post-passivation interconnect 72' to connect the drivers, receivers or I/O circuits 45 to the common ESD circuit 44. Each driver, receiver or I/O circuit 45 is connected to the internal circuits 42 through the post-passivation interconnects 72. The drivers, receivers, or I/O circuits 45 and the ESD circuit 44 are connected to the external circuits at the contact point 70. Multiple (more than two) drivers, receivers, and/or I/O circuits 45 can be connected to multiple ESD circuits 44 (more than one) using the post-passivation interconnects 72'. In FIG. 4j, three drivers, receivers, or I/O circuits, 45, 45', 45", and two ESD circuits 44, 44' are connected through low impedance post-passivation interconnects, 73, consisting of two networks 73' and 73". The drivers, receivers or I/O circuits 45, 45' 45" are then connected to internal circuits 42 through post-passivation interconnects 72.

Figure 5A:
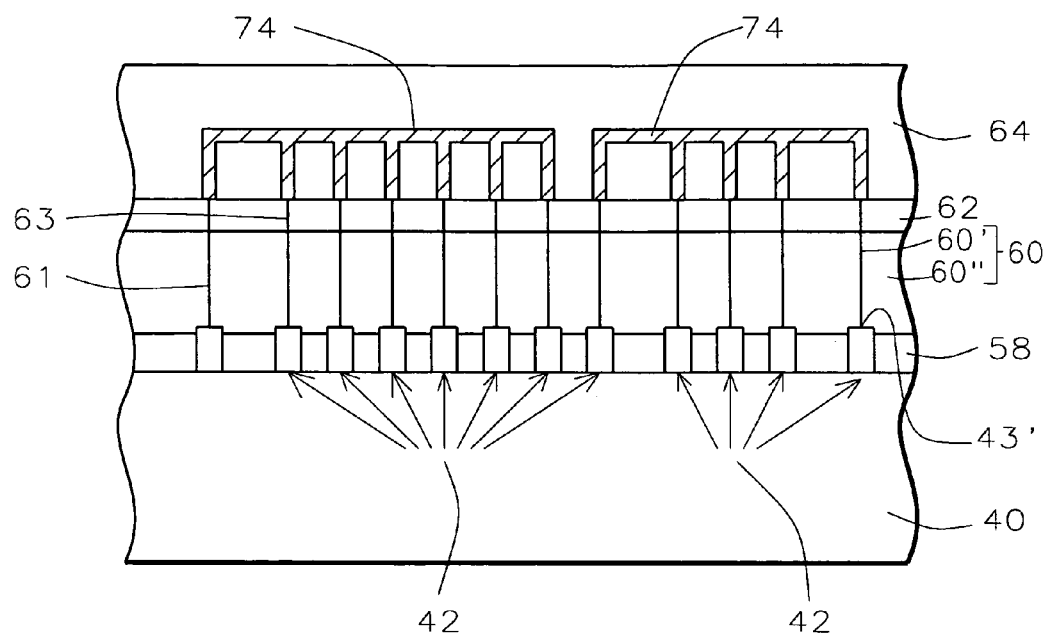
FIG. 5a is a representation of a silicon substrate over which an interconnect network is created according to the invention. No I/O connect pad is provided for external connection in specific networks. The chip structure that is shown in FIGS. 5a and 5b addresses clock and signal distribution networks of the invention.

FIG. 5a shows a representation of a silicon substrate 40 over which an interconnect network is created according to the invention, with the post-passivation interconnect network created in a thick layer 64 of dielectric overlying a layer 62 of passivation and remaining internal to the thick layer 64 of dielectric. No ESD, receiver, driver or I/O circuit access pad is provided for external connection to the internal circuits 42. Shown in FIG. 5a and not previously highlighted is the clock or signal post-passivation interconnect line 74, providing for an interconnect scheme of thick, wide lines overlying a passivation layer whereby no external I/O connections are provided. Due to the thick, wide lines of the interconnect network 74 that is created overlying a passivation layer 62, the clock and signal distribution can take place entirely within the dielectric layer 64; this as opposed to prior art methods where, for clock and signal distribution lines, each thick, wide interconnect 74 line (where such thick, wide interconnect lines are used) must be provided with at least one I/O connect point for off-chip connection.

The method that is used to create the wide thick line post-passivation interconnect lines that is shown in cross section in FIG. 5a can be summarized as follows and is similar to that described above for FIG. 4a. A silicon substrate 40 is provided. Active devices 42 have been provided in and/or on the surface of the substrate 40. First thin layers 58 of dielectric are deposited over the surface of the substrate 40, a fine-line interconnect network 60 is created in the first layers 60" of dielectric comprising fine-line interconnect lines 60', making contact with points of electrical contact in the surface of the substrate 40. A layer 62 of passivation is deposited over the surface of the first layers 60" of dielectric. Second thick layers 64 of dielectric are deposited over the surface of the passivation layer 62, a post-passivation interconnect network is created in the second layers 64 of dielectric comprising thick, wide interconnect lines 74, created by selective deposition, making contact with points of electrical contact in the passivation layer 62.

Figure 5B:
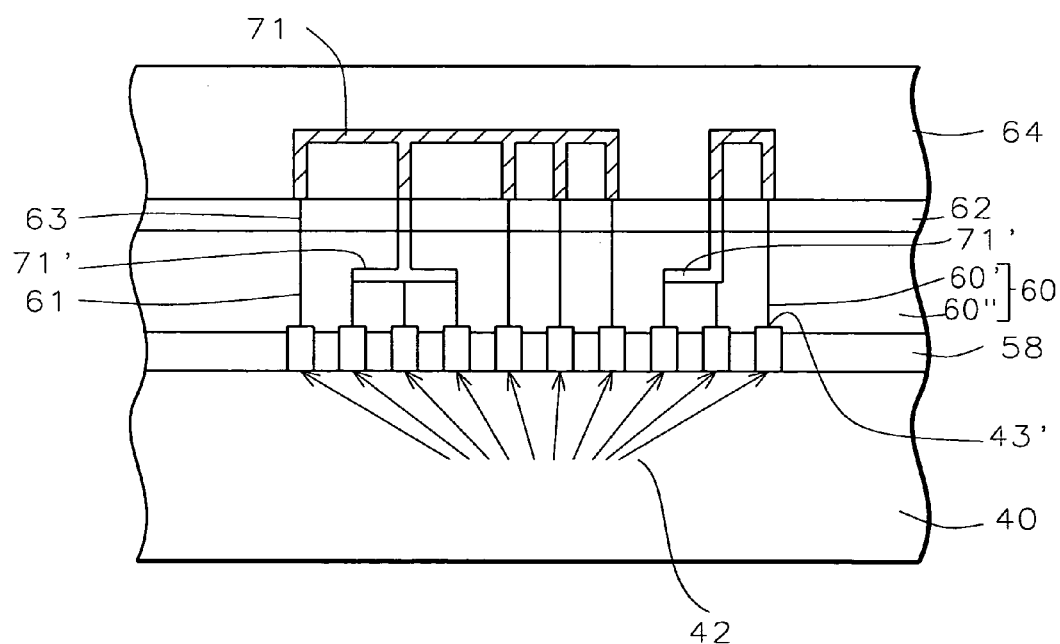
FIG. 5b differentiates between clock and signal distribution lines that are below a layer of passivation and clock and signal distribution lines that are above a layer of passivation.
Figure 5C:
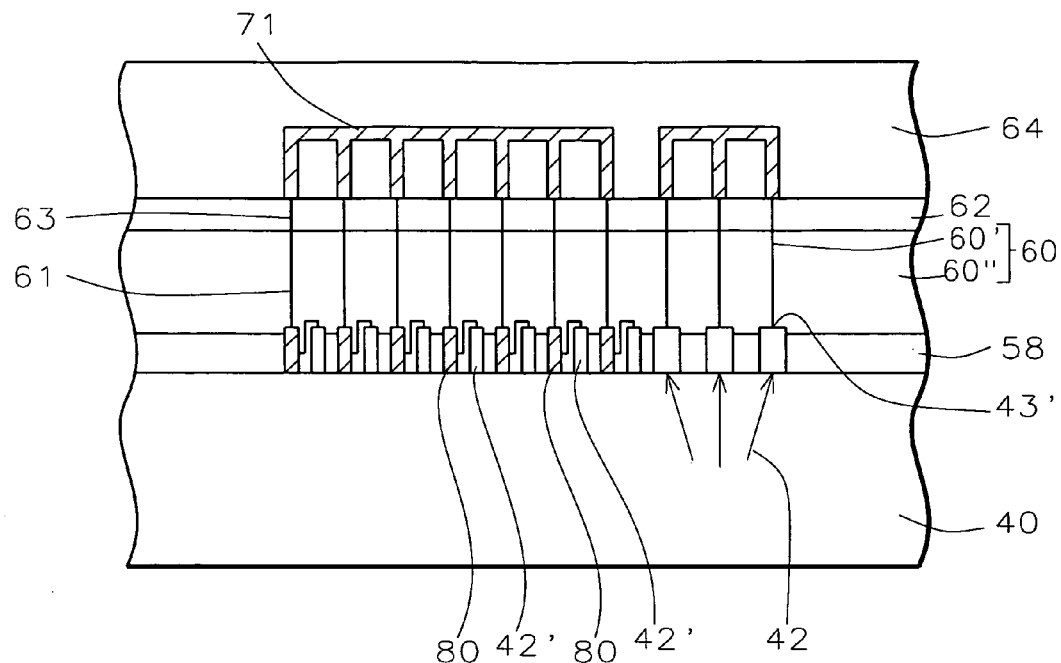
FIGS. 5c and 5d show smaller intra-chip circuit drivers.
Figure 5D:
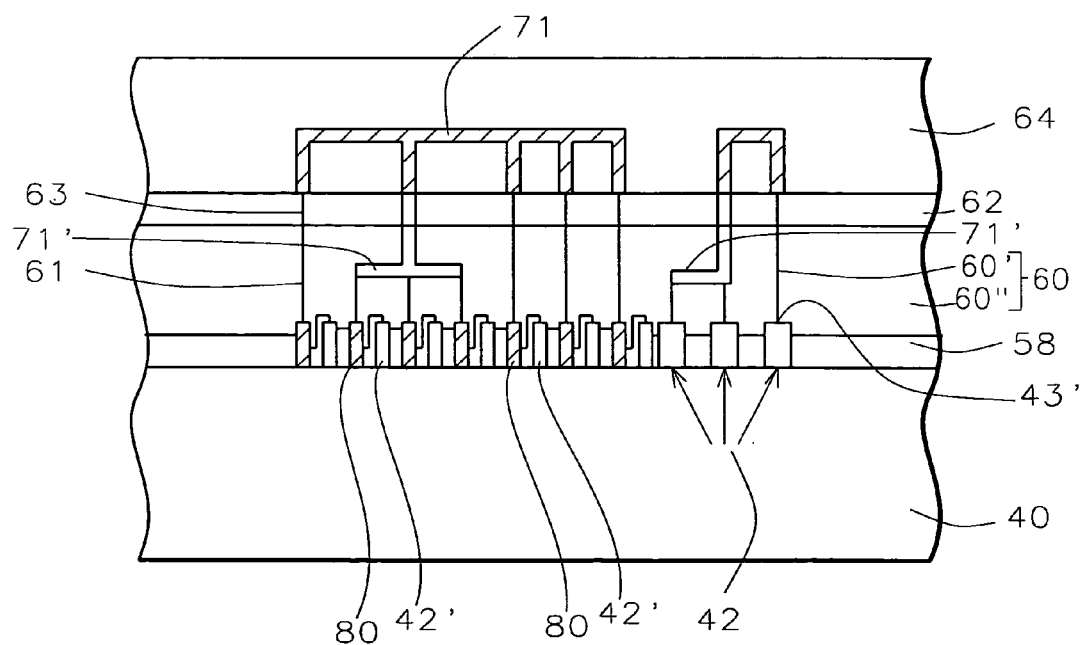

FIG. 5b provides further insight into the creation of the signal and clock interconnect lines of the invention whereby these interconnect lines have been shown as post-passivation interconnect lines 71 and fine line interconnect lines 71'. Post-passivation interconnect lines 71 have been created above the layer 62 of passivation and can act as global signal and clock interconnect lines. Fine line interconnect lines 71' have been created below the layer 62 of passivation and act as local signal and clock interconnect lines 71'. Also as shown in FIG. 5a, internal circuits 42 are shown. Circuits 42 have no I/O circuits and no ESD circuits. FIGS. 5c and 5d show smaller internal driver circuits 80 connected to the internal circuits 42', while no smaller internal drivers are connected to the internal circuits 42.

Figure 5E:
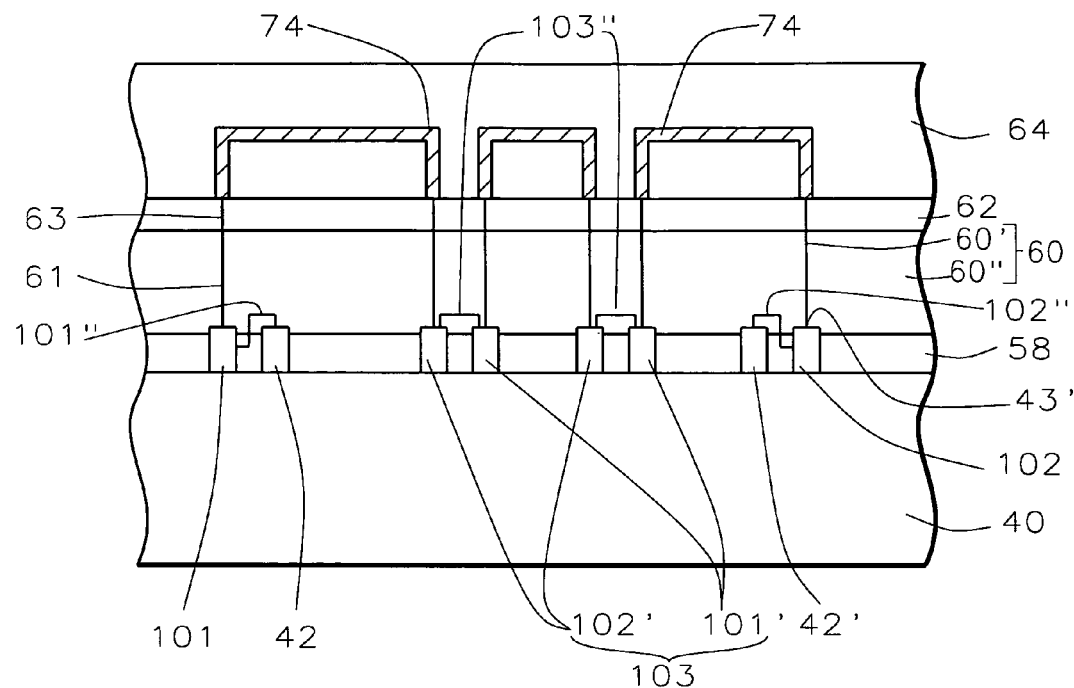
FIG. 5e shows a series of driver/receivers, or transceivers, or repeater devices using the post-passivation interconnects of the present invention.

FIG. 5e shows a series of driver/receivers, 101' 102' or transceivers, 103 or repeater 103 devices. An internal circuit 42 is connected to an internal circuit 42' at a distance. To interconnect these two circuits 42, 42' at a significant distance, a series of repeaters or transceivers 103 together with the post-passivation interconnects 74 are applied. A repeater or transceiver 103 consists typically of a receiver 102' and a driver 101', using connection 103" in series. The circuit 42 uses fine line connection 101" to connect to an on-chip driver 101, driving through post-passivation interconnects 74, and passing repeaters 103, and arriving at the receiver 102 and the internal circuit 42'. The repeaters or transceivers combined with the post-passivation interconnects provide methods for interconnecting different functions on a system-on-a-chip (SOC) chip.

It must further be emphasized that, where FIGS. 3–5 show a fine-line interconnect network 60 that underlies the layer 62 of passivation, the invention also enables and can be further extended with the complete elimination of the fine-line interconnect network 60 and creating an post-passivation interconnect network 66, 71, 72', 73, 74 that uses only thick, wide wires. For this application of the invention, the first layer 60" of dielectric is not applied and the layer 62 of passivation is deposited directly over the surface of the created semiconductor devices 42 in or on the surface of substrate 40.

The post-passivation interconnection lines of the present invention are formed of thick, wide metal layers, the thickness reducing resistance. Use of the intermetal polymer dielectric between metal layers reduces capacitance. With the reduced capacitance, a higher frequency of operation results due to a higher resonant frequency.

Resistance (per unit length) of metal interconnections in an integrated circuit is determined by the material to be used and metal thickness and width, while capacitance (per unit length) is related to dielectric types, thickness, and metal line width, spacing, and thickness. Metal capacitance includes three components: 1) plate capacitance which is a function of the metal width to dielectric thickness aspect ratio, 2) coupling capacitance which is a function of the metal thickness to line spacing aspect ratio, and 3) fringing capacitance which is a function of metal thickness, spacing, and dielectric thickness.

In a first example, to the extreme of the fine line metal capability, fine line metal thickness is about 2 µm, fine line metal width is about 10 µm, fine line IMD thickness is about 2 µm, and the line spacing is about 10 µm. Post-passivation metal thickness is about 5 µm, metal width is about 10 µm, dielectric thickness is about 5 µm, and lines spacing is also about 10 µm. The metal thickness difference results in a 2.5 times reduction in resistance (per unit length) in the post-passivation metal structure over the fine line metal structure. The dielectric thickness results in a 2.5 times difference in capacitance (per unit length) in the post-passivation metal structure over the fine line metal structure. Then, the reduction in resistance times capacitance (per unit length) (RC product (per unit length)) is 6.25 times, or about 5 times.

In a second example, fine line metal thickness is about 1 µm, fine line metal width is about 10 µm, fine line IMD thickness is about 0.5 µm, and the line spacing is about 2 µm. Post-passivation metal thickness is about 5 µm, metal width is about 10 µm, dielectric thickness is about 5 µm, and lines spacing is about 10 µm. The metal thickness difference results in about a 5 times reduction in resistance (per unit length) in the post-passivation metal structure over the fine line metal structure. The capacitance (per unit length) is dominated in this case by plate capacitance with a reduction of 10 times difference in capacitance (per unit length) in the post-passivation metal structure over the fine line metal structure. Then, the reduction in RC product (per unit length) is about 50 times.

In a third example, typical capability fine line metal thickness is about 0.4 µm, fine line metal width is about 0.2 µm, fine line IMD thickness is about 0.4 µm, and the line spacing is about 0.2 µm. Post-passivation metal thickness is about 5 µm, metal width is about 10 µm, dielectric thickness is about 5 µm, and line spacing is about 10 µm. The metal thickness difference results in about a 625 times reduction in resistance (per unit length) in the post-passivation metal structure over the fine line metal structure. The capacitance (per unit length) is dominated by coupling capacitance and results in about a 4 times difference in capacitance (per unit length) in the post-passivation metal structure over the fine line metal structure. Then, the reduction in RC product (per unit length) is about 2,500 times.

In a fourth example, typical capability fine line metal thickness is about 0.4 µm, fine line metal width is about 0.2 µm, fine line IMD thickness is about 0.4 µm, and the line spacing is about 0.2 µm. Post-passivation metal thickness is about 10 µm, metal width is about 10 µm, dielectric thickness is about 10 µm, and line spacing is about 40 µm. The metal thickness difference results in about a 1250 times reduction in resistance (per unit length) in the post-passivation metal structure over the fine line metal structure. The capacitance (per unit length) is dominated by coupling capacitance and results in about an 8 times difference in capacitance (per unit length) in the post-passivation metal structure over the fine line metal structure. Then, the reduction in RC product (per unit length) is about 10,000 times.

Summarizing the above discussion, the RC product (per unit length) of the post-passivation metal structure can be about 5 to 10,000 times smaller than the RC product (per unit length) of the fine line metal structure.

It is difficult to achieve 100 times smaller RC product (per unit length) for the top layer metal of a fine line metallization system when compared to the bottom layer metal in the fine line metal interconnection process. For example, the metal line resistance (per unit length) at the top layer metal can be reduced by designing a wide piece of metal, while the capacitance (per unit length) of that metal line will be increasing accordingly (because the IMD is thin). Essentially, it is hard for fine line IC metals to achieve even 10 times smaller RC product (per unit length) for its top metal layer versus its bottom metal layer.

Sheet resistance is calculated by dividing the resistivity of the metal by the metal thickness. Sheet resistance is independent of metal line width (W) and length (L), and is in a unit of resistance per square. The number of square is counted by dividing length (L) by width (W), LAN. For example, resistivity of aluminum is 3.0 micro-ohm-cm, resistivity of copper is 2 micro-ohm-cm, and resistivity of gold is 2.2 micro-ohm-cm. In fine line metallization, for aluminum lines having a thickness of 0.8 µm, the sheet resistance is 38 milliohms per square. Damascene copper lines having a thickness of one micron have a sheet resistance of 20 milliohms per square. In contrast, the post-passivation metal lines of the present invention typically have a metal sheet resistance of less than 7 milliohms per square. For example, if the post-passivation metal line is a 5.0 µm thick copper line, the sheet resistance is 4 milliohms per square. If the post-passivation metal line is a 4.0 µm thick gold line, the sheet resistance is 5.5 milliohms per square.

In summary, the sheet resistance of the post-passivation metal is at least two times smaller than the sheet resistance of the fine line metal. As shown in the examples above, the sheet resistance of the post-passivation metal can be five times smaller than the sheet resistance of the fine line metal. For some applications of post-passivation metal, a 10 µm thick copper thickness is used. In this case, the sheet resistance is 2 milliohms per square, which is at least 10 times smaller than that of the fine line metal.

It is further of value to briefly discuss the above implemented and addressed distinction between fine-line interconnect lines and wide, thick post-passivation interconnect lines. The following points apply in this respect:

the prior art fine line interconnect lines are created underneath a layer of passivation, the wide, thick post-passivation interconnect lines of the invention are created above a layer of passivation the fine-line interconnect lines are typically created in a layer of inorganic dielectric; the thick wide post-passivation interconnect lines are typically created in a layer of dielectric comprising polymer. This is because an inorganic material cannot be deposited as a thick layer of dielectric because such a layer of dielectric could develop fissures and crack as a result. Although the polymer is preferred, the thick wide post-passivation interconnect lines could be formed over a conventional passivation layer without the polymer fine-line interconnect metal is typically created using methods of sputter with resist etching or of damascene processes using oxide etch with electroplating after which CMP is applied. Either one of these two approaches cannot create thick metal due to cost considerations or metal stress or oxide cracking thick, wide post-passivation interconnect lines can be created by first sputtering a thin metal base layer, coating and patterning a thick layer of photoresist, applying a thick layer of metal by selective electroplating, removing the patterned photoresist and performing metal base etching (of the sputtered thin metal base). This method allows for the creation of a pattern of very thick, wide metal; metal thickness in excess of 1 μm can in this manner be achieved while the thickness of the layer of dielectric in which the thick metal interconnect lines are created can be in excess of 2 μm. In the selective deposition process, the metal is electroplated only where it is needed. In contrast, in the standard metal damascene process used for fine line metallization, metal is electroplated everywhere and then etched or polished away where it is not needed. This is a waste of expensive metal, especially in those cases where precious metal such as gold, silver, or palladium is used. The removed metal is often contaminated and may not be able to be reused or may be very expensive to reuse.

The fine line interconnect lines must be fabricated in a stringent clean room environment of class 10 or less while the post-passivation interconnect lines can be fabricated in a much less expensive clean room environment of class 100 or more.

The RC product (per unit length) —resistance times capacitance of the post-passivation interconnection lines is much smaller than the RC product of the fine line interconnect lines.

In summary, the post-passivation interconnection of the present invention can connect to three types of circuits (i) off-chip drivers, receivers, I/O circuits, and ESD circuits, (ii) intra-chip drivers and receivers, and (iii) internal circuits. No driver is required for freeway interconnection with a distance<"D". A smaller driver is used for freeway interconnection with a distance>"D"; that is, intra-chip connection. For I/O and ESD circuits, a large driver, larger than the intra-chip driver, is used for off-chip connection.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An integrated circuit chip comprising:
a silicon substrate;
an ESD circuit in or on said silicon substrate;
an internal circuit in or on said silicon substrate, wherein said internal circuit comprises a MOS device;
a dielectric layer over said silicon substrate;
a first metallization structure over said silicon substrate and in said dielectric layer, wherein said first metallization structure is connected to said ESD circuit;
a second metallization structure over said silicon substrate and in said dielectric layer, wherein said second metallization structure is connected to said internal circuit;
a passivation layer over said dielectric layer;
a first via in said passivation layer, wherein said first via is connected to said first metallization structure;
a second via in said passivation layer, wherein said second via is connected to said second metallization structure; and
a third metallization structure over said passivation layer, wherein said third metallization structure is connected to said first and second vias, wherein said ESD circuit is connected to said internal circuit through, in sequence, said first metallization structure, said first via, said third metallization structure, said second via and said second metallization structure, and wherein said third metallization structure comprises a metal line having a sheet resistance of smaller than 7 milliohms per square, said metal line comprising an adhesion/barrier layer, a seed layer on said adhesion/barrier layer and an electroplated metal layer on said seed layer, wherein the material of said electroplated metal layer is the same as that of said seed layer, wherein an undercut with an edge of said adhesion/barrier layer recessed from an edge of said electroplated metal layer is between 0.03 and 2 micrometers.

2. The integrated circuit chip of claim 1, wherein said metal line has a thickness between 2 and 100 micrometers.

3. The integrated circuit chip of claim 1, wherein said metal line has a width greater than 2 micrometers.

4. The integrated circuit chip of claim 1, wherein said electroplated metal layer comprises electroplated gold.

5. The integrated circuit chip of claim 1, wherein said passivation layer comprises a nitride layer having a thickness greater than 0.3 micrometers.

6. The integrated circuit chip of claim 1, wherein said passivation layer comprises an oxide layer and a nitride layer over said oxide layer.

7. The integrated circuit chip component of claim 1, wherein said adhesion/barrier layer comprises titanium.

8. An integrated circuit chip comprising:
a silicon substrate;
a driver, receiver or I/O circuit in or on said silicon substrate;
an internal circuit in or on said silicon substrate, wherein said internal circuit comprises a MOS device;
a first metallization structure over said silicon substrate and in said dielectric layer, wherein said first metallization structure is connected to a first node of said driver, receiver or I/O circuit;
a second metallization structure over said silicon substrate and in said dielectric layer, wherein said second metallization structure is connected to said internet circuit;
a passivation layer over said dielectric layer;
a first via in said passivation layer, wherein said first via is connected to said first metallization structure;
a second via in said passivation layer, wherein said second via is connected to said second metallization structure;
a third metallization structure over said passivation layer, wherein said third metallization structure is connected to said first and second vias, wherein said first node of said driver, receiver or I/O circuit is connected to said internal circuit through, in sequence, said first metallization structure, said first via, said third metallization structure, said second via and said second metallization structure, and wherein said third metallization structure comprises a metal line having a sheet resistance of smaller than 7 milliohms per square; and
a fourth metallization structure over said silicon substrate and in said dielectric layer, wherein said fourth metallization structure connects a second node of said driver, receiver or I/O circuit to an external circuit.

9. The integrated circuit chip of claim 8, wherein said metal line has a thickness between 2 and 100 micrometers.

10. The integrated circuit chip of claim 8, wherein said metal line has a width greater than 2 micrometers.

11. The integrated circuit chip component of claim 8, wherein said metal line comprises electroplated gold.

12. The integrated circuit chip component of claim 8, wherein said passivation layer comprises a nitride layer having a thickness greater than 0.3 micrometers.

13. The integrated circuit chip of claim 8, wherein said passivation layer comprises an oxide layer and a nitride layer over said oxide layer.

14. The integrated circuit chip of claim 8, wherein said metal line comprises a titanium-containing layer and a metal layer on said titanium-containing layer.

15. An integrated circuit chip comprising:
a silicon substrate;
a first internal circuit in or on said silicon substrate, wherein said first internal circuit comprises a MOS device;
a second internal circuit in or on said silicon substrate;
a dielectric layer over said silicon substrate;
a first metallization structure over said silicon substrate and in said dielectric layer, wherein said first metallization structure is connected to said first internal circuit;
a second metallization structure over said silicon substrate and in said dielectric layer, wherein said second metallization structure is connected to said second internal circuit;
a passivation layer over said dielectric layer, wherein said passivation layer comprises an oxide layer and a nitride layer over said oxide layer, wherein said passivation layer comprises an oxide layer and a nitride layer over said oxide layer, wherein said nitride layer has a thickness greater than 0.3 micrometers;
a first via in said passivation layer, wherein said first via is connected to said first metallization structure;
a second via in said passivation layer, wherein said second via is connected to said second metallization structure; and
a third metallization structure over said passivation layer, wherein said third metallization structure is connected to said first and second vias, wherein said first internal circuit has a signal node connected to said second internal circuit through, in sequence, said first metallization structure, said first via, said third metallization structure, said second via and said second metallization structure, and wherein said third metallization structure comprises a metal line having a sheet resistance of smaller than 7 milliohms per square, said metal line comprising an adhesion/barrier layer, a seed layer on said adhesion/barrier layer and an electroplated metal layer on said seed layer, wherein the material of said electroplated metal layer is the same as that of said seed layer, wherein an undercut with an edge of said adhesion/barrier layer recessed from an edge of said electroplated metal layer is between 0.03 and 2 micrometers.

16. The integrated circuit chip of claim 15, wherein said metal line has a thickness between 2 and 100 micrometers.

17. The integrated circuit chip of claim 15, wherein said metal line has a width greater than 2 micrometers.

18. The integrated circuit chip of claim 15, wherein said electroplated metal layer comprises electroplated gold.

19. The integrated circuit chip of claim 15, wherein said passivation layer comprises a nitride layer having a thickness greater than 0.3 micrometers.

20. The integrated circuit chip of claim 15, wherein said passivation layer comprises an oxide layer and a nitride layer over said oxide layer.

21. The integrated circuit chip of claim 15, wherein said adhesion/barrier layer comprises titanium.

22. The integrated circuit chip of claim 1, wherein said electroplated metal layer comprises electroplated copper.

23. The integrated circuit chip of claim 1, wherein said metal line further comprises a nickel layer on said electroplated metal layer.

24. The integrated circuit chip of claim 1 further comprising a polymer layer between said passivation layer and said third metallization structure.

25. The integrated circuit chip of claim 1 further comprising a polymer layer over said third metallization structure.

26. The integrated circuit chip of claim 8, wherein said metal line comprises electroplated copper.

27. The integrated circuit chip of claim 8, wherein said metal line comprises nickel.

28. The integrated circuit chip of claim 8 further comprising a polymer layer between said passivation layer and said third metallization structure.

29. The integrated circuit chip of claim 8 further comprising a polymer layer over said third metallization structure.

30. The integrated circuit chip of claim 15, wherein said electroplated metal layer comprises electroplated copper.

31. The integrated circuit chip of claim 15, wherein said metal line further comprises a nickel layer on said electroplated metal layer.

32. The integrated circuit chip of claim 15 further comprising a polymer layer between said passivation layer and said third metallization structure.

33. The integrated circuit chip of claim 15 further comprising a polymer layer over said third metallization structure.

* * * * *

UNITED STATES PATENT AND TRADEMARK OFFICE
CERTIFICATE OF CORRECTION

| | |
|---|---|
| PATENT NO. | : 7,372,161 B2 |
| APPLICATION NO. | : 11/017145 |
| DATED | : May 13, 2008 |
| INVENTOR(S) | : Mou-Shiung Lin et al. |

Page 1 of 1

It is certified that error appears in the above-identified patent and that said Letters Patent is hereby corrected as shown below:

On the Title Page, at Related U.S. Application Data, after Item (60), please replace:

"Continuation-in-part of application No. 10/962,963, filed on Oct. 12, 2004, and a continuation-in-part of application No. 10/278,106, filed on Oct. 22, 2002, now Pat. No. 6,734,563, which is a division of application No. 09/691,497, filed on Oct. 18, 2000, now Pat. No. 6,495,442." with --This application is a continuation-in-part of application No. 10/962,963, filed on Oct. 12, 2004, now pending. This application is related to Ser. No. 10/685,872, filed on Oct. 15, 2003, now pending, and to Ser. No. 10/278,106, filed on Oct. 22, 2002, now U.S. Pat. No. 6,734,563, which is a divisional of Ser. No. 09/691,497, filed on Oct. 18, 2000, now U.S. Pat. No. 6,495,442, all assigned to a common assignee and all incorporated herein by reference in their entirety. The application is also related to application No. 09/721,722, filed on Nov. 27, 2000, now U.S. Pat. No. 6,303,423, assigned to a common assignee and incorporated herein by reference in its entirety.--

Signed and Sealed this
Twenty-ninth Day of January, 2013

David J. Kappos
*Director of the United States Patent and Trademark Office*